United States Patent
Ko et al.

(10) Patent No.: US 9,859,432 B2
(45) Date of Patent: Jan. 2, 2018

(54) SEMICONDUCTOR DEVICES HAVING SPACER PROTECTION PATTERN

(71) Applicant: Samsung Electronics Co., Ltd., Suwon-si, Gyeonggi-do (KR)

(72) Inventors: Yongsun Ko, Suwon-si (KR); Sangjine Park, Suwon-si (KR); Hagju Cho, Seongnam-si (KR); Byungjae Park, Seongnam-si (KR); Jeongnam Han, Seoul (KR)

(73) Assignee: Samsung Electronics, Inc. (KR)

( * ) Notice: Subject to any disclaimer, the term of this patent is extended or adjusted under 35 U.S.C. 154(b) by 0 days.

(21) Appl. No.: 15/245,549

(22) Filed: Aug. 24, 2016

(65) Prior Publication Data
US 2017/0154991 A1 Jun. 1, 2017

(30) Foreign Application Priority Data
Nov. 27, 2015 (KR) .................. 10-2015-0167596

(51) Int. Cl.
*H01L 29/06* (2006.01)
*H01L 29/78* (2006.01)
*H01L 29/423* (2006.01)

(52) U.S. Cl.
CPC ........ *H01L 29/785* (2013.01); *H01L 29/0649* (2013.01); *H01L 29/42372* (2013.01)

(58) Field of Classification Search
CPC ............... H01L 29/785; H01L 29/0649; H01L 29/42372
See application file for complete search history.

(56) References Cited

U.S. PATENT DOCUMENTS

| | | |
|---|---|---|
| 8,264,021 B2 | 9/2012 | Lai et al. |
| 8,431,466 B2 | 4/2013 | Lin et al. |
| 8,815,742 B2 | 8/2014 | Cai et al. |
| 9,029,930 B2 | 5/2015 | Kelly et al. |
| 9,071,242 B2 | 6/2015 | Yang et al. |
| 9,129,986 B2 | 9/2015 | Zang et al. |
| 9,312,376 B2 | 4/2016 | Kim et al. |
| 2011/0049637 A1* | 3/2011 | Wiatr ................ H01L 21/28123 257/368 |
| 2015/0034941 A1 | 2/2015 | Hargrove et al. |
| 2015/0111362 A1 | 4/2015 | Shieh et al. |
| 2015/0140762 A1 | 5/2015 | He et al. |

* cited by examiner

*Primary Examiner* — Thanh V Pham
(74) *Attorney, Agent, or Firm* — Myers Bigel, P.A.

(57) ABSTRACT

A semiconductor device may include a pair of active patterns spaced apart from each other in a first direction, a pair of gate electrodes intersecting the pair of the active patterns in a second direction crossing the first direction, gate spacers on sidewalls of the pair of the active patterns, source/drain regions on the pair active patterns between the pair of the gate electrodes, and a spacer protection pattern between the pair of the gate electrodes and between the pair of the active patterns. The spacer protection pattern may be commonly connected to the gate spacers.

20 Claims, 23 Drawing Sheets

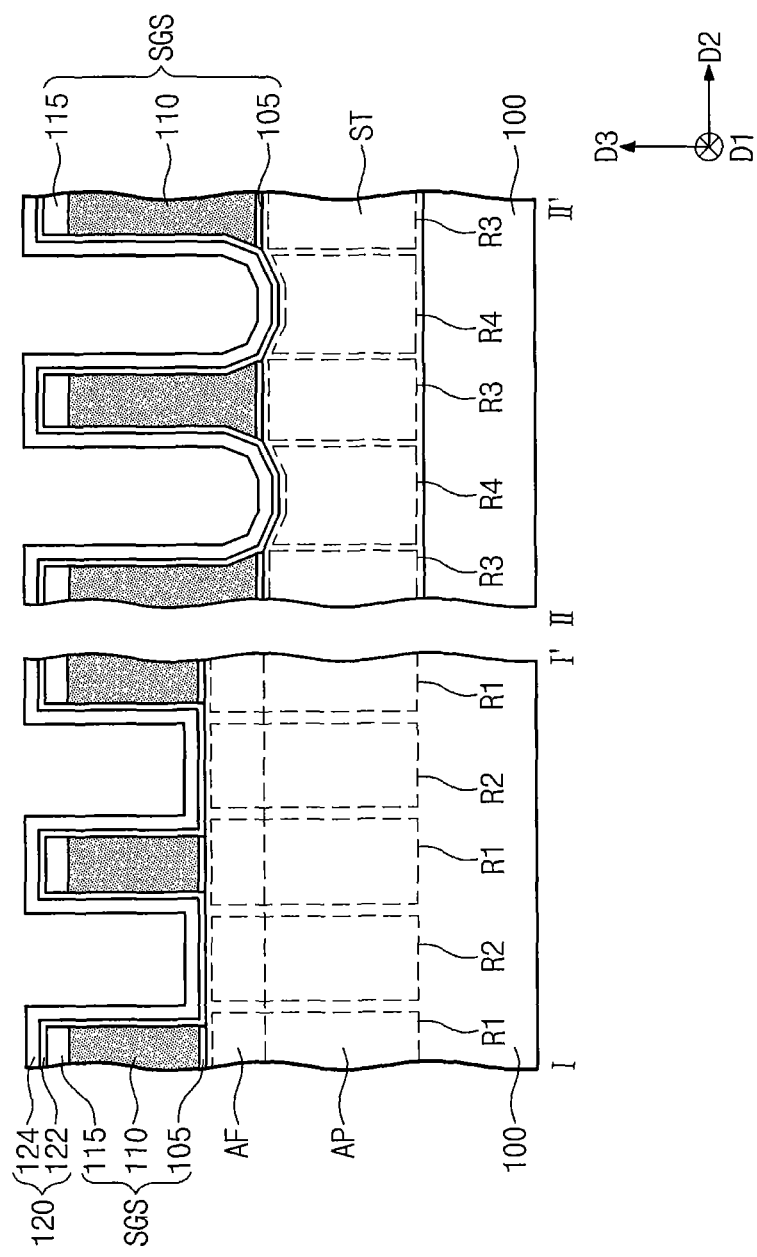

SEMICONDUCTOR DEVICES HAVING SPACER PROTECTION PATTERN

CROSS-REFERENCE TO RELATED APPLICATION

This application claims priority under 35 U.S.C. §119 to Korean Patent Application No. 10-2015-0167596, filed on Nov. 27, 2015, in the Korean Intellectual Property Office, the disclosure of which is hereby incorporated by reference in its entirety.

BACKGROUND

Technical Field

Example embodiments of the inventive concept relate to semiconductor devices. More specifically, example embodiments of the inventive concept relate to semiconductor devices including fin field effect transistors.

Description of Related Art

A semiconductor device may include an integrated circuit including metal-oxide-semiconductor (MOS) field effect transistors. Sizes and design rules of the MOS field effect transistors have been increasingly reduced as semiconductor devices have become more highly integrated; thus, operation characteristics of semiconductor devices may deteriorate. Various methods for improving the performance of semiconductor devices have been developed to overcome limitations caused by high integration density of semiconductor devices.

SUMMARY

Example embodiments of the inventive concept may provide a semiconductor device having improved electrical characteristics and reliability.

According to example embodiments of the inventive concept, a semiconductor device may comprise a first active pattern and a second active pattern protruding from a substrate, the first and second active patterns being spaced apart from each other in a first direction, a first gate electrode and a second gate electrode intersecting the first and second active patterns and being spaced apart from each other in a second direction crossing the first direction, a first gate spacer on a sidewall of the first gate electrode and a second gate spacer on a sidewall of the second electrode, a first source/drain region and a second source/drain region on the first active pattern and the second active pattern, respectively, between the first and second gate electrodes, the first and second source/drain regions being adjacent to each other in the first direction, and a spacer protection pattern between the first and second active patterns and between the first and second gate electrodes. The spacer protection pattern may be commonly connected to the first and second spacers and may commonly contact the first and second source/drain regions.

According to example embodiments of the inventive concept, a semiconductor device may comprise first through third active patterns protruding from a substrate and parallel to each other, the first and second active patterns being spaced apart from each other by a first distance, the third active pattern being spaced apart from the second active patterns by a second distance, which is greater than the first distance, a first gate electrode and a second electrode intersecting the first through third active patterns, a first gate spacer and a second gate spacer on sidewalls of the first gate electrode and the second gate electrode, respectively, first through third source/drain regions on the first through third active patterns, respectively, at a side of each of the first and second gate electrodes, and a first spacer protection pattern extending between the first and second active patterns and commonly connected to the first and second gate spacers, the first spacer protection pattern including a same material as the first and second gate spacers.

According to example embodiments of the inventive concept, a semiconductor device, comprises a substrate, a first gate electrode and a second gate electrode on the substrate, a first gate spacer and a second gate spacer on sidewalls of the first gate electrode and the second gate electrode, respectively, and a spacer protection pattern connecting the first gate spacer to the second gate spacer.

It is noted that aspects of the inventive concept described with respect to one embodiment, may be incorporated in a different embodiment although not specifically described relative thereto. That is, all embodiments and/or features of any embodiment can be combined in any way and/or combination. These and other aspects of the inventive concept are explained in detail in the specification set forth below.

BRIEF DESCRIPTION OF THE DRAWINGS

Example embodiments will be more clearly understood from the following detailed description taken in conjunction with the accompanying drawings in which:

FIGS. 7A, 8A, 9A, 10A, 11A, 12A, and 13A are cross sectional views illustrating a method of manufacturing a semiconductor device according to an example embodiment of the inventive concept and correspond to cross sectional views taken along the lines I-I' and II-II' of FIG. 1, respectively;

DETAILED DESCRIPTION OF THE EXAMPLE EMBODIMENTS

To more specifically describe example embodiments, various features will be described in detail with reference to the attached drawings. However, the example embodiments described are not limited thereto.

Figure 1:
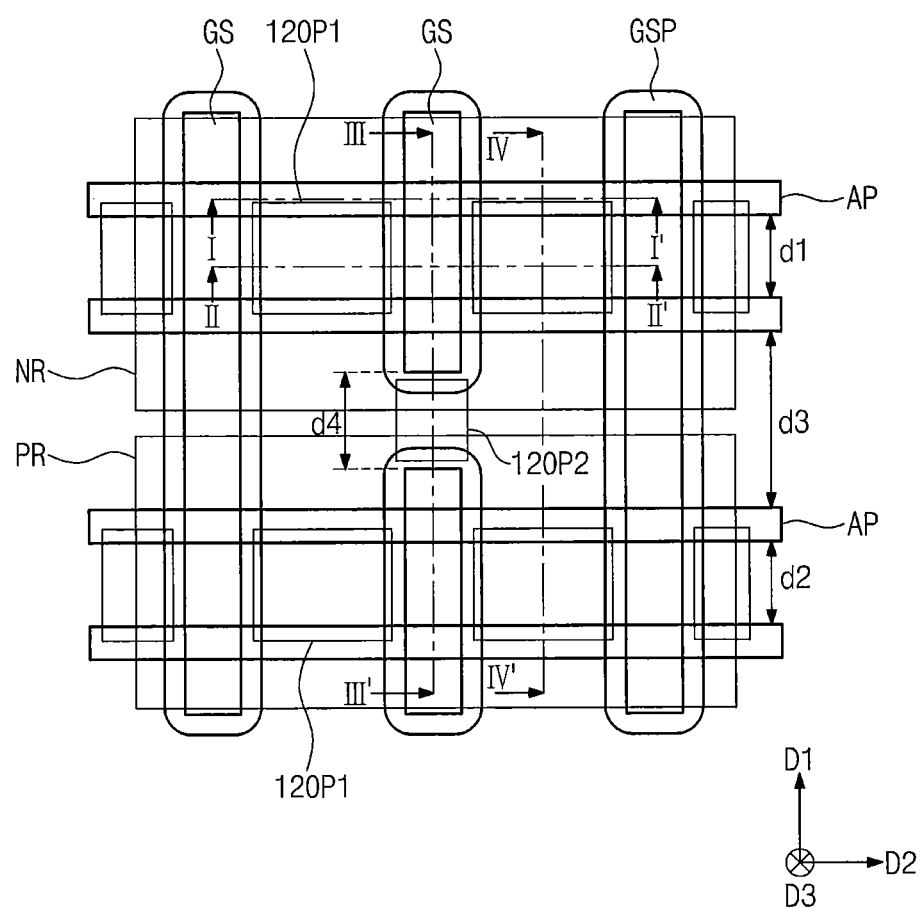
FIG. 1 is a plan view illustrating a semiconductor device according to an example embodiment of the inventive concept.
Figure 2A:
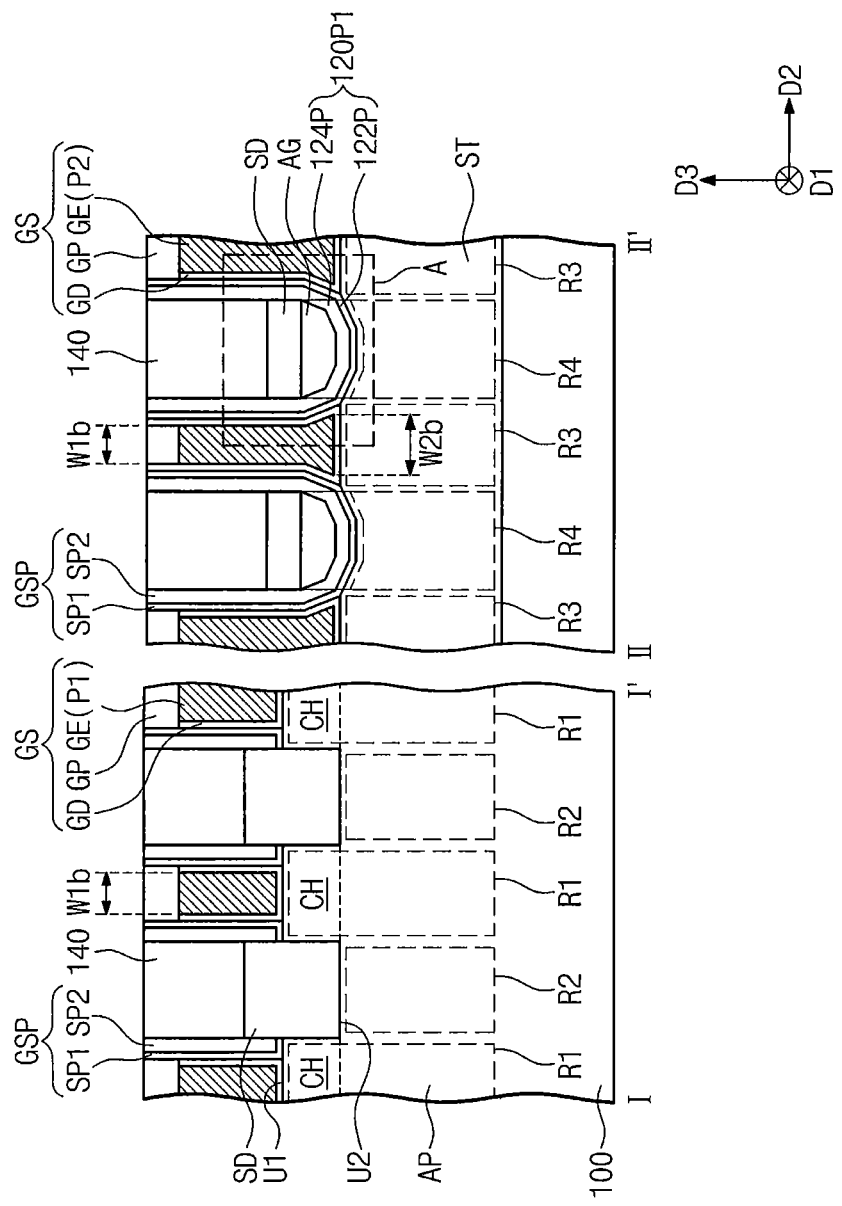
FIG. 2A is a cross-sectional view illustrating cross-sections taken along lines I-I' and II-II' of FIG. 1.
Figure 2B:
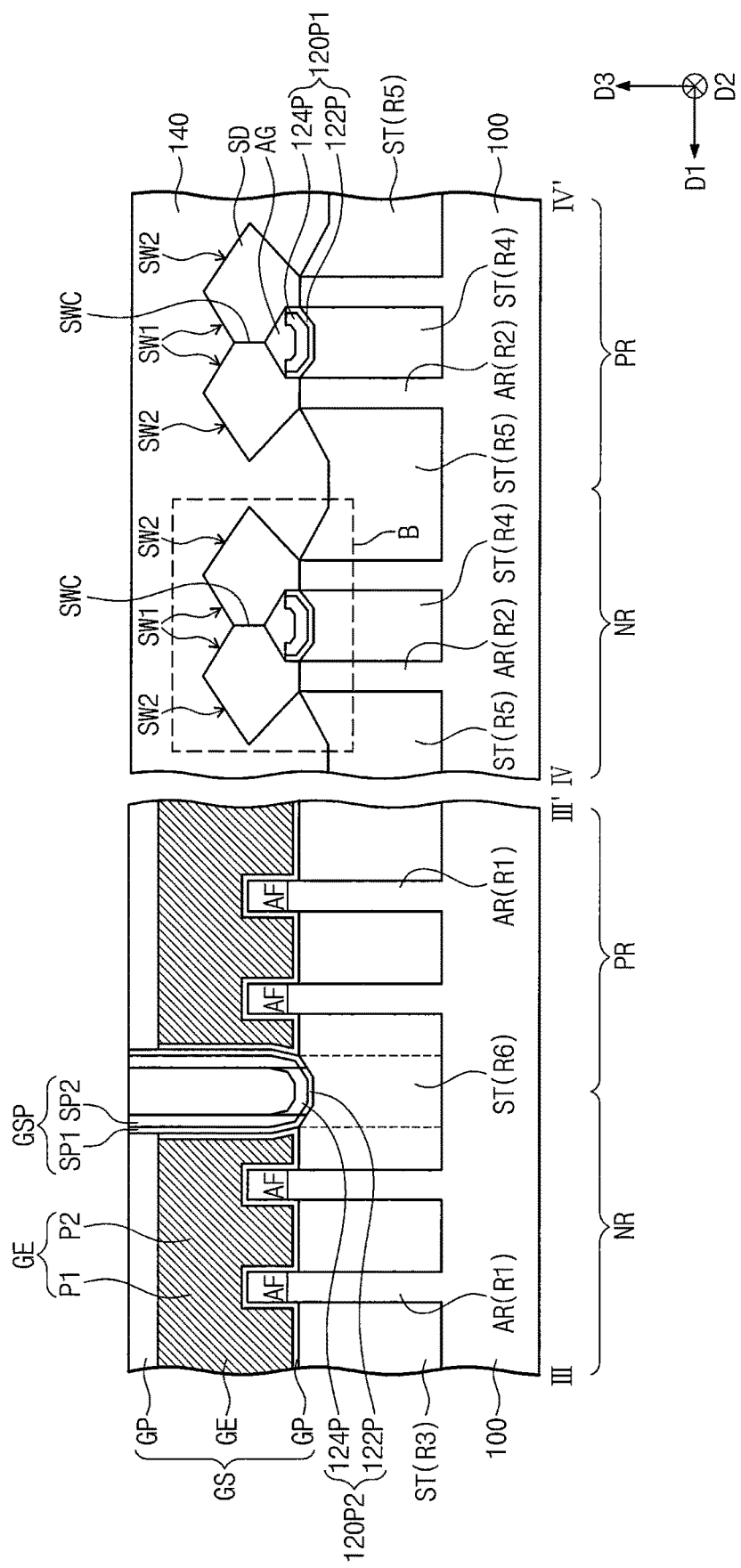
FIG. 2B is a cross-sectional view illustrating cross-sections taken along lines III-III' and IV-IV' of FIG. 1.

FIG. 1 is a plan view illustrating a semiconductor device according to an example embodiment of the inventive concept. FIG. 2A is a cross-sectional view illustrating cross-sections taken along lines I-I' and II-II' of FIG. 1. FIG. 2B is a cross-sectional view illustrating cross-sections taken along lines III-III' and IV-IV' of FIG. 1. FIGS. 3A, 3C, 4A, 5A, and 6A are enlarged views corresponding to portion "A" of FIG. 2A, respectively. FIGS. 3B, 4B, 5B, and 6B are enlarged views corresponding to portion "B" of FIG. 2B, respectively.

Referring to FIGS. 1, 2A, 2B, 3A, and 3B, a substrate 100 may include an n-type MOS field effect transistor (NMOSFET) region NR and a p-type MOS field effect transistor (PMOSFET) region PR. The substrate 100 may be semiconductor substrate. For example, the substrate 100 may include a silicon substrate, a germanium substrate, or a silicon on insulator (SOI) substrate. The NMOSFET region NR and the PMOSFET region PR may be arranged in, for example, a first direction D1. The first direction D1 may be parallel to a top surface of the substrate 100. N-type transistors may be disposed in the NMOSFET region NR and p-type transistors may be disposed in the PMOSFET region PR.

Active patterns AP may be disposed in the NMOSFET and PMOSFET regions NR and PR. The active patterns AP may be arranged in the first direction D1 and may extend in a second direction D2 crossing the first direction D1 and parallel to the top surface of the substrate 100. The active patterns AP may protrude upwardly from the substrate 100. For example, the active patterns AP may protrude in a third direction D3 perpendicular to the top surface of the substrate (e.g., orthogonal to the first and second directions D1 and D2). The active patterns AP may each be, for example, a portion of the substrate 100. In some embodiments, the active patterns AP may each include an epitaxial layer grown from the substrate 100. The active patterns AP in the NMOSFET region NR may have a p-type conductivity, and the active patterns AP in the PMOSFET region PR may have an n-type conductivity. Although two active patterns AP in each of the NMOSFET and PMOSFET regions NR and PR are illustrated in the drawings, the example embodiments of the inventive concept are not limited thereto.

In some embodiments, the active patterns AP in the NMOSFET region NR may be spaced apart from one another by a first distance d1, and the active patterns AP in the PMOSFET region PR may be spaced apart from one another by a second distance d2. Adjacent ones of the active patterns AP in the NMOSFET region NR and the active patterns AP in the PMOSFET region PR may be spaced apart from one another by a third distance d3 greater than the first and second distances d1 and d2. The third distance d3 may be a minimum distance by which the NMOSFET region NR and the PMOSFET region PR having different conductivity types are separated from one another. The first distance d1 may be substantially equal to the second distance d2, but embodiments of the inventive concept are not limited thereto.

Each of the active patterns AP may include a first region R1 under a gate structure GS and a second region R2 at opposite sides of the gate structure GS. A top surface U2 of the second region R2 is lower than a top surface US1 of the first region R1 relative to the top surface of the substrate 100. In some embodiments, the top surface U2 of the second region R2 may have a concave shaped configuration toward the substrate 100 in a cross sectional view. In this case, a height of the top surface U2 of the second region R2 may correspond to a height of a lowermost portion of the top surface U2 of the second regions R2.

A device isolation pattern ST may be disposed on the substrate 100 to cover a portion of sidewalls of each of the active patterns AP. Upper portions of the active patterns AP may be exposed by the device isolation pattern ST. For example, upper portions of the first regions R1 may be exposed by the device isolation pattern ST. The exposed upper portions of the first regions R1 may be defined as active fins AF. Each of the active fins AF may be selectively or locally disposed under the gate structure GS. The device isolation pattern ST may include third through fifth regions R3, R4, and R5. The third region R3 may be positioned under the gate structure GS and may vertically overlap with the gate structure GS.

Figure 3A:
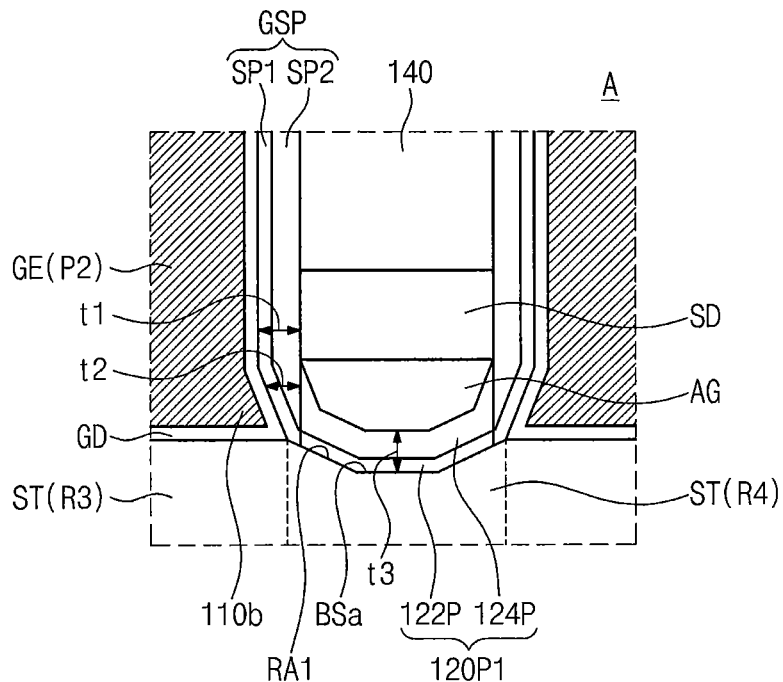
FIGS. 3A, 3C, 4A, 5A, and 6A are enlarged views corresponding to portion "A" of FIG. 2A, respectively.
Figure 3B:
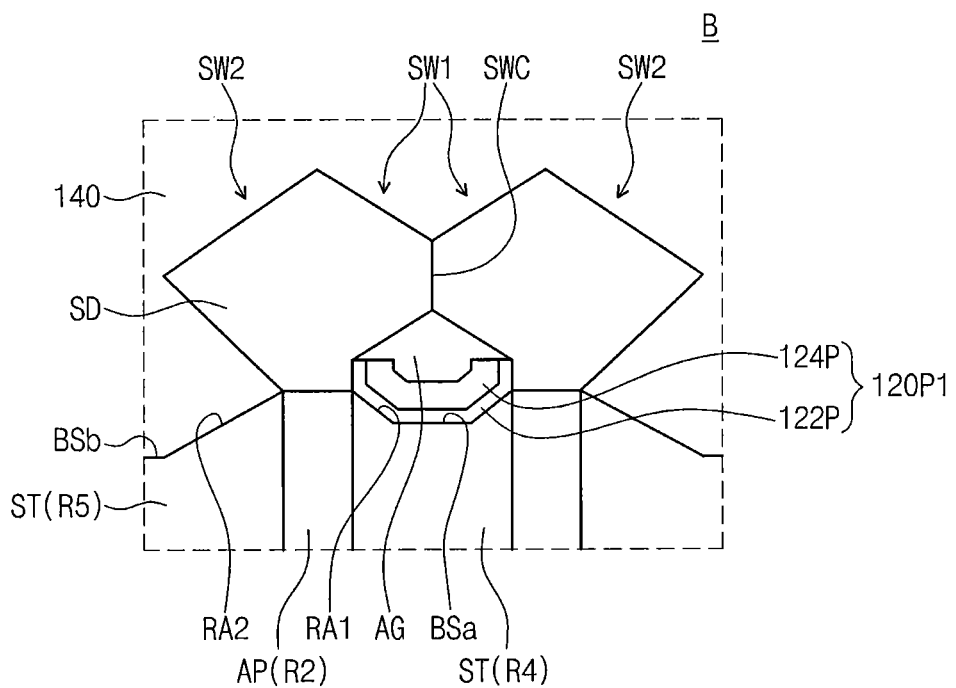
FIGS. 3B, 4B, 5B, and 6B are enlarged views corresponding to portion "B" of FIG. 2B, respectively.
Figure 3C:
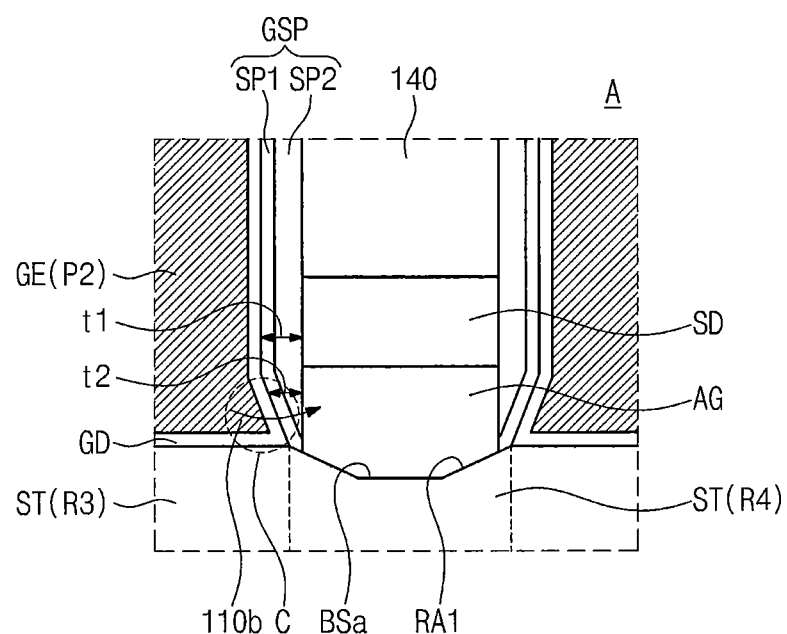

The fourth and fifth regions R4 and R5 may be positioned at opposite sides of the gate structure GS and be horizontally spaced apart from the third region R3. For example, the fourth and fifth regions R4 and R5 may be positioned between the gate structures GS. The fourth region R4 may be positioned between adjacent fin active patterns AP in each of the NMOSFET and PMOSFET regions NR and PR. The fifth region R5 may be positioned at a side of a pair of the active patterns AP in each of the NMOSFET and PMOSFET regions NR and PR. The fifth region R5 may be positioned between adjacent ones of the fin active patterns AP in the NMOSFET region NR and the fin active patterns AP in the PMOSFET region PR. Upper portions of the fourth and fifth regions R4 and R5 may be recessed. Thus, the fourth and fifth regions R4 and R5 may have a first recess region RA1, which has a first bottom surface BSa and a second recess region RA2, which has a second bottom surface BSb, respectively, as shown in FIG. 3B. For example, the fourth and fifth regions R4 and R5 may have lower portions of top surfaces corresponding to the first bottom surface BSa and the second bottom surface BSb, respectively. The recessed depths of the first and second recess regions RA1 and RA2 may be different from each other depending on an integration density of the fin active patterns AP. For example, one portion of the device isolation pattern ST at a region where a space between the active patterns AP is narrow, e.g., at a high pattern density region may be recessed less than another portion of the device isolation region at a region where a space between the active patterns AP is wide, e.g., at a low pattern density region. In other words, the first bottom surface BSa of the first recess region RA1 may be lower than a top surface of the third region R3 of the device isolation pattern ST and may be higher than the second bottom surface BSb of the second recess region RG2 relative to the top surface of the substrate 100. The device isolation pattern ST may include, for example, silicon oxide.

The gate structure GS may be disposed on the substrate 100. The gate structure GS may extend in the first direction D1 and may intersect the active patterns AP of each of the NMOSFET and PMOSFET regions NR and PR. For example, the gate structure GS may cover top surfaces and sidewalls of the active fins AF and the top surface of the device isolation pattern ST between the active fins AP (e.g., the top surface of the third region R3). Each of the active fins AF that is locally positioned under the gate structure GS may be referred to as a channel region CH. A plurality of gate structure GS may be provided on the substrate 100. The plurality of the gate structures GS may be arranged in the second direction D2. In some embodiments, at least two gate structures GS may be arranged to form one row and may be separated from one another in the first direction D1 (e.g., in a lengthwise direction of a gate electrode). For example, the two gate structures GS forming one row may be spaced apart from one another by a fourth distance d4, which is less than the third distance d3 in the first direction D1. One of the two gate structures GS forming one row may intersect the active patterns AP of the NMOSFET region NR, and another of the two gate structures GS may intersect the active patterns AP of the PMOSFET region PR. The two gate structures GS forming one row may expose a portion of the third region R3 of the device isolation pattern ST. The exposed portion of the third region R3 of the device isolation pattern ST may be referred to as a sixth region R6. An upper portion of the sixth region R6 may be recessed like the fourth and fifth regions R4 and R5. A top surface of the sixth region R6 may have a concave shaped configuration toward the substrate 100 in a cross sectional view.

The gate structure GS may include a gate electrode GE, a gate dielectric pattern GD, and a gate capping pattern GP. The gate structure GS as described above may extend in the first direction D1 to intersect at least one of the active patterns AP. Accordingly, the gate electrode GE may include a first portion P1 on the first region R1 of the active pattern AP, a second portion P2 on the third region R3 of the device isolation pattern ST. In a plan view, the first portion P1 of the gate structure GS may overlap with the first region R1, and the second portion P2 of the gate structure GS may overlap with the third region R3. In some embodiments, the second portion P2 may include a protrusion 110b protruding outwardly from sidewalls of the gate structure GS as shown in FIG. 3A. The protrusion 110b may have a downward inclined sidewall. A sidewall profile of the first portion P1 may be different from a sidewall profile of the second portion P2. For example, a sidewall of the first portion P1 may be substantially vertical to the top surface of the substrate 100, and a sidewall of the second portion P2 may include a sloped portion and a substantially vertical portion relative to the top surface of the substrate 100 (or a sidewall of the second portion P2 may have a concave shaped configuration). In other words, a width W1b of the first portion P1 may be substantially same at upper and lower parts of the first portion P1, and a lower width W2b of the second portion P2 may be greater than an upper width W1b of the second portion P2, which is substantially equal to the width W1b of the first portion P1. The gate electrode GE may include at least one of a conductive metal nitride, e.g., titanium nitride, and/or tantalum nitride, and a metal, e.g., aluminum and/or tungsten.

The gate dielectric pattern GD may be disposed between the gate electrode GE and the active fins AF. The gate dielectric pattern GD may extend from the active fins AF to the device isolation pattern ST to cover the top surface of the third region R3 of the device isolation pattern ST. The gate dielectric pattern GD may extend along a bottom surface of the gate electrode GE. Further, the gate dielectric pattern GD may be disposed between the gate electrode GE and a gate spacer GSP. The gate dielectric pattern GD may include a high-k dielectric material. For example, the gate dielectric pattern GD may include hafnium oxide, hafnium silicate, zirconium oxide, and/or zirconium silicate, but it is not limited thereto. The gate capping pattern GP may be disposed on a top surface of the gate electrode GE and extend in the first direction D1. The gate capping pattern GP may include, e.g., silicon nitride or silicon oxynitride.

The gate spacer GSP may be disposed on sidewalls of the gate structure GS (e.g., sidewalls of the gate electrode GE). The gate spacer GSP may be disposed on first sidewalls of the gate structure GS which are opposite one another in the second direction D2. The gate spacer GSP may be further disposed on second sidewalls of the gate structure GS, which are opposite one another in the first direction D1. For example, the gate spacer GSP may include a pair of line-type portions extending along the first sidewalls of the gate electrode GE in the first direction D1 and a pair of connection portions connecting the pair of line-type portions and extending along the second sidewalls of the gate electrode GE. Thus, the gate spacer GSP may have a loop shape in a plan view. In other words, the gate spacer GSP may surround the sidewalls of the gate structure GS (e.g., the sidewalls of the gate electrode GE).

The gate spacer GSP may be provided to have a single-layered structure or a multi-layered structure. As an example, the gate spacer GSP may include a first gate spacer SP1 on the sidewalls of the gate structure GS and a second gate spacer SP2 on outer sidewalls of the first gate spacer SP1. The first gate spacer SP1 may be disposed between the gate structure GS (e.g., the gate electrode GE) and the second gate spacer SP2. A thickness of the second gate spacer SP1 may be substantially equal to or greater than a thickness of the first gate spacer SP2, but it is not limited thereto. In some embodiments, the first and second gate spacers SP1 and SP2 may be include a same material, for example, silicon nitride, silicon oxynitride, and/or silicon oxycarbonitride. In this case, the gate spacer GSP may have a single-layered structure. In other embodiments, the first and second gate spacers SP1 and SP2 may include different materials. For example, the first gate spacer SP1 may include silicon oxycarbonitride and the second gate spacer SP2 may include silicon nitride. Alternatively, the first gate spacer SP1 may include silicon nitride and the second gate spacer SP2 may include silicon oxycarbonitride. Thus, the gate spacer GSP may have a double-layered structure. In some embodiments, the gate spacer GSP may have a structure formed of three or more of layers.

Because the gate electrode GE has the protrusion 110b, a second thickness t2 of a lower portion of the gate spacer GSP, which horizontally overlaps the protrusion 110b, may be decreased in a downward direction toward the substrate 100 (e.g., as being closer to the device isolation pattern ST) as shown in FIG. 3A. An upper portion of the gate spacer GSP over the protrusion 110b may have a first thickness t1, which is substantially equal in the downward direction toward the substrate 100. The first and second thicknesses t1 and t2 may be defined as a horizontal width or a distance between the sidewall of the gate structure GS and an outer sidewall of the gate spacer GSP.

First and second spacer protection patterns 120P1 and 120P2 may be disposed on the fourth and sixth regions R4 and R6 of the device isolation pattern ST, respectively, as shown in FIGS. 1, 2A and 2B. The first and second spacer protection patterns 120P1 and 120P2 may reduce or prevent a failure caused by the decreased thickness of the lower portion of the gate electrode GE. Each of the first and second spacer protection patterns 120P1 and 120P2 may contact the top surface of the device isolation pattern ST thereunder and may be connected to the lower portion of the gate spacer GSP. The first and second spacer protection patterns 120P1 and 120P2 may each have a single-layered structure or a multi-layered structure. For example, the first and second spacer protection patterns 120P1 and 120P2 may each have a first sub-spacer protection pattern 122P contacting the top surface of the device isolation pattern ST and a second sub-spacer protection pattern 124P on the first sub-spacer protection pattern 122P. In some embodiments, the first and second spacer protection patterns 120P1 and 120P2 may each include only the first sub-spacer protection pattern 122P. The first and second sub-spacer protection patterns 122P and 124P may respectively include the same material as the first and second gate spacers SP1 and SP2. As an example, the first and second sub-spacer protection patterns 122P and 124P may include silicon nitride, silicon oxynitride, and/or silicon oxycarbonitride.

The first spacer protection pattern 120P1 on the fourth region R4 of the device isolation pattern ST between the adjacent gate electrodes GE in the second direction D2 may be commonly connected to (or integrally coupled with) a pair of the gate spacers GSP, which are spaced apart from each other by the fourth region R4 in the second direction D2 and are disposed on opposite ones of sidewalls of adjacent gate electrodes GE in the second direction D2. The first spacer protection pattern 120P1 may extend between the adjacent gate electrodes GE in the second direction D2 and between adjacent source/drain regions in the first direction D1. In a cross sectional view taken along the second direction D2, the pair of the gate spacers GSP on the opposite ones of the sidewalls of adjacent gate electrodes GE in the second direction D2 and the first spacer protection pattern 120P1 extending between the pair of the gate spacers GSP may be connected to each other to have a U-shaped configuration. Furthermore, the first spacer protection pattern 120P1 on the fourth region R4 between the adjacent gate electrodes GE in the second direction D2 may cover an entirety of the top surface of the fourth region R4 thereunder. The second spacer protection pattern 120P2 on the sixth region R6 of the device isolation pattern ST between the adjacent gate electrodes GE in the first direction D1 (e.g., a lengthwise direction of the gate electrode GE) may be commonly connected to (or integrally coupled with) a pair of the gate spacers GSP, which are spaced apart from each other by the sixth region R4 in the first direction D1 and are disposed on opposite ones of the sidewalls of adjacent gate electrodes GE in the first direction D1. In other words, the pair of the gate spacers GSP, which are spaced apart from each other by the sixth region R6 in the first direction D1, may be connected to each other by the second spacer protection pattern 120P2.

In some embodiments, as shown in FIGS. 3A and 3B, the first spacer protection pattern 120P1 may have a third thickness t3 that is substantially equal to the first thickness t1 of the upper portion of the gate spacer GSP. The third thickness t3 may be defined as a vertical thickness of the first spacer protection pattern 120P1 on the first bottom surface BSa of the first recess region RA1. A portion of the first spacer protection pattern 120P1 may protrude over the top surface U2 of the second region R2 of the active pattern AP to contact sidewalls of source/drain regions SD adjacent thereto.

The source/drain regions SD may be disposed at opposite sidewalls of the gate structures GS. The source/drain regions SD may be disposed on the second region R2 of the active patterns AP. The source/drain regions SD in the NMOSFET region NR may have an n-type conductivity (e.g., n-type dopants) and the source/drain regions SD in the PMOSFET region PR may have a p-type conductivity (e.g., p-type dopants). In some embodiments, the source/drain regions SD may include an epitaxial pattern grown using the active pattern AP as a seed layer. In this case, the source/drain regions SD in the NMOSFET region NR may include a material imparting a tensile stress to the channel regions CH and the source/drain regions SD in the PMOSFET region PR may include a material imparting a compressive stress to the channel regions CH. In some embodiments, when the substrate 100 is a silicon substrate, the source/drain regions SD in the NMOSFET region NR may include a silicon carbide (SiC) layer whose a lattice constant is less than that of silicon or a silicon (Si) layer whose a lattice constant is equal to that of the silicon substrate 100, and the source/drain region SD in the PMOSFET region PR may include a silicon germanium (SiGe) layer whose lattice constant is greater than that of silicon. Each of the channel regions CH in the NMOSFET and PMOSFET regions NR and PR may be disposed between adjacent source/drain regions SD in the second direction D2.

In a cross section view taken along the first direction D1, adjacent source/drain regions SD in the first direction D1 in each of the NMOSFET and PMOSFET regions NR and PR may be connected to (or integrally coupled with) each other. For example, first sidewalls SW1, which face each other, among sidewalls of the adjacent source/drain regions SD in the first direction D1 may be connected to each other. An air gap AG or void may be disposed under a connected portion SWC of the first sidewalls SW1 of the source/drain regions SD. The air gap AG may be a region in which a solid phase material is not provided and may be an empty space. In some embodiments, the air gap AG may be filled with a gas. According to embodiments of the inventive concept, a bottom of the air gap AG may be defined by a top surface of the first spacer protection pattern 120P1 on the fourth region R4. In some embodiments, lower portions of the connected first sidewalls SW1 of the adjacent source/drain regions SD in the first direction D1 may contact the first spacer protection pattern 120P1. The first spacer protection pattern 120P1 may commonly contact the adjacent source/drain regions SD in the first direction D2. Meanwhile, in a cross section view taken along the first direction D1, second sidewalls SW2 (e.g., outer sidewalls), which are opposite to the first sidewalls SW1, of the adjacent source/drain regions SD may have a steep tip in a lateral direction (or in the first direction D1). In other words, the second sidewalls SW2 of the source/drain regions SD may each include a lower portion, which is substantially negatively slanted relative to the top surface of the substrate 100, and an upper portion, which is substantially positively slanted relative to the top surface of the substrate 100.

Figure 4A:
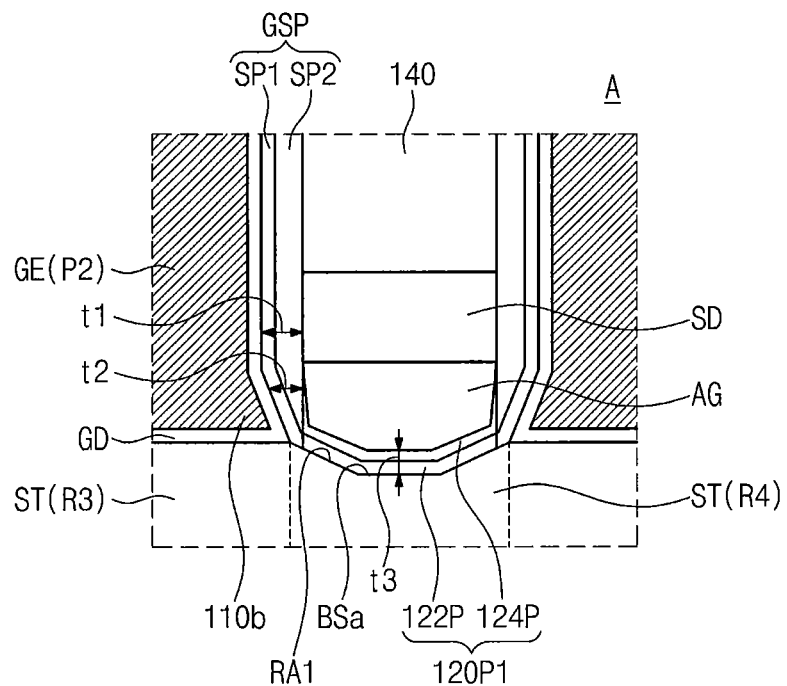
Figure 4B:
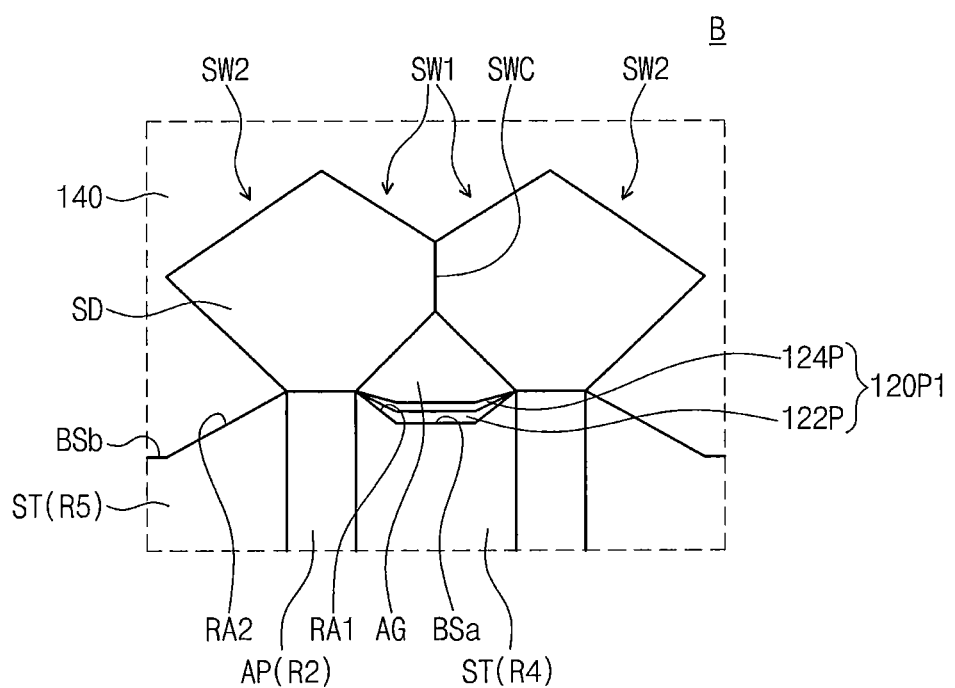

The first spacer protection pattern 120P1 and the source/drain regions SD may be provided in various forms. In some example embodiments, as illustrated in FIGS. 4A and 4B, the first spacer protection pattern 120P1 may not contact the first sidewalls SW1 of the source/drain regions SD, which are adjacent thereto. In this case, the third thickness t3 of the first spacer protection pattern 120P1 may be less than the first thickness t1 of the gate spacer GSP.

Figure 5A:
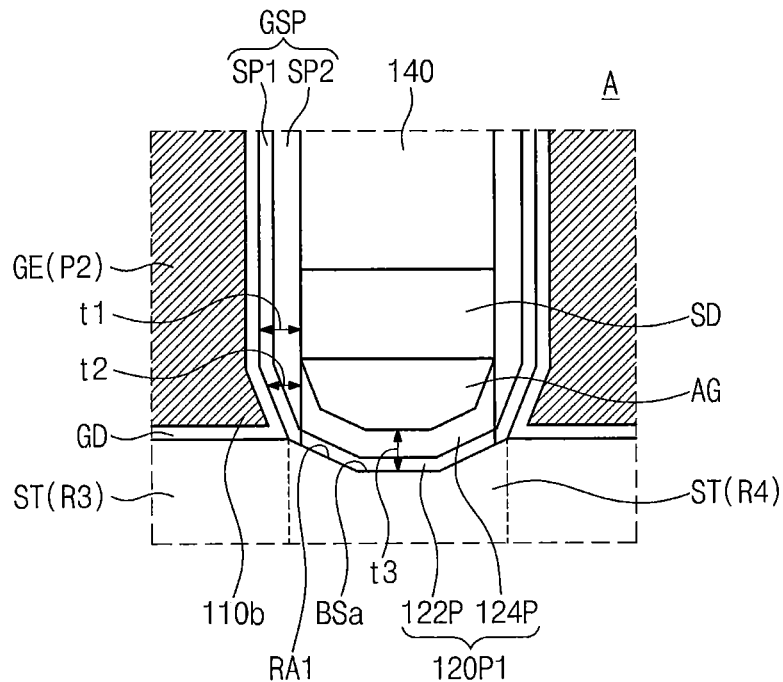
Figure 5B:
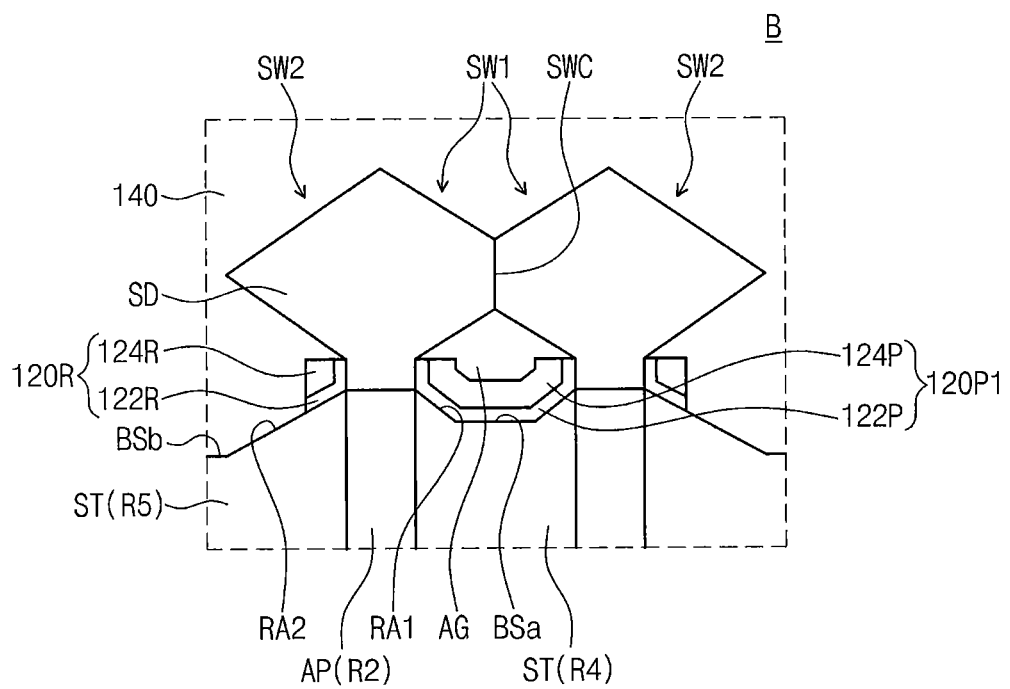

In some example embodiments, as illustrated in FIGS. 5A and 5B, remaining spacers 120R may be disposed on the second sidewalls SW2 of the source/drain regions SD. The lower portions of the second sidewalls SW2 of the source/drain regions SD may contact the remaining spacers 120R. Accordingly, a lower portion of each of the source/drain regions SD may have a width corresponding to a distance between the first spacer protection pattern 120P1 and the remaining spacers 120R. The remaining spacers 120R may be disposed on the top surface of the fifth region R5 of the device isolation pattern ST adjacent to the second region R2 of the active pattern AP. The remaining spacers 120R may each include a first remaining spacer 122R contacting a corresponding one of the second sidewalls SW2 of the source/drain regions SD and a second remaining spacer 124R, which is on the corresponding one of the second sidewalls SW2 of the source/drain regions SD. The first remaining spacer 122R may be disposed between the second remaining spacer 124R and each of the second sidewalls SW2 of the source/drain regions SD. The first and second remaining spacers 122R and 124R may respectively include the same material as the first and second gate spacers SP1 and SP2.

Figure 6A:
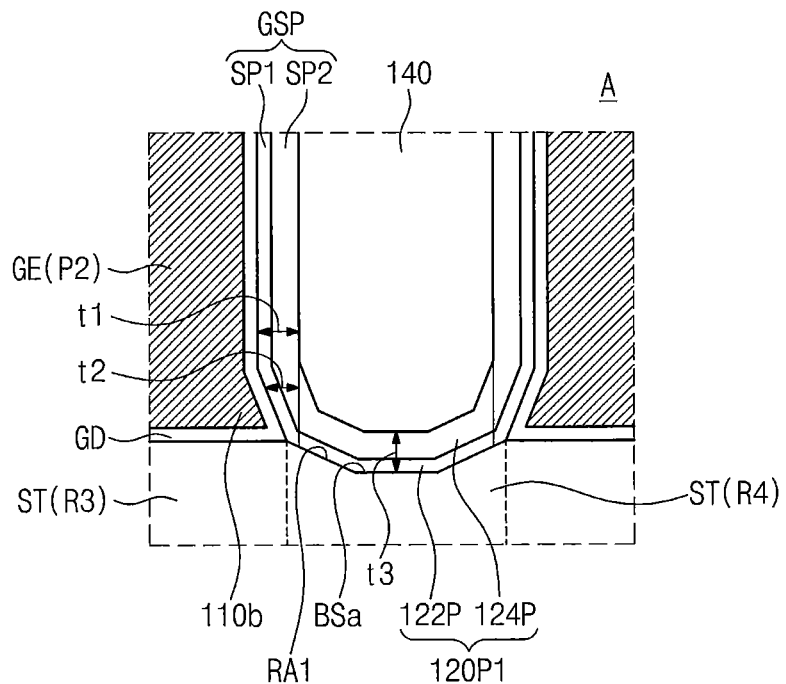
Figure 6B:
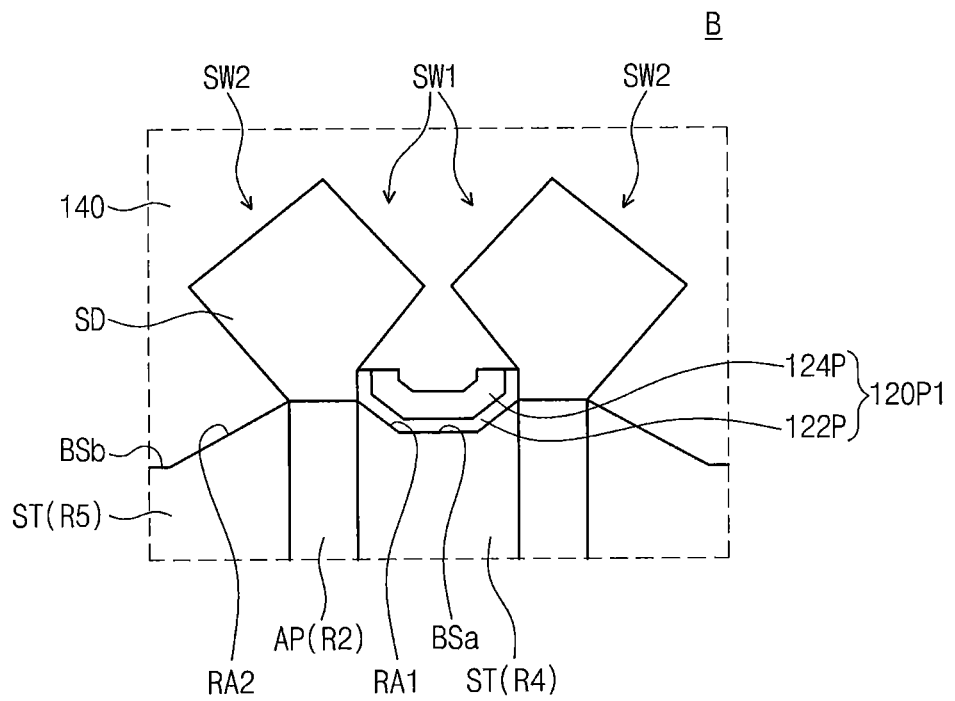

In some example embodiments, as illustrated in FIGS. 6A and 6B, the first sidewalls SW1, which face each other, of adjacent source/drain regions SD may be spaced apart from each other. Meanwhile, an example embodiment of FIGS. 6A and 6B may be applied to the example embodiment of FIGS. 4A and 4B and the example embodiment of FIGS. 5A and 5B.

Referring again to FIGS. 1, 2A, 2B, 3A, and 3B, a lower interlayer insulating layer 140 may be disposed to cover the source/drain regions SD and the sidewalls of the gate structures GS. A top surface of the lower interlayer insulating layer 140 may be substantially coplanar with top surfaces of the gate structures GS and gate spacers GSP. The lower interlayer insulating layer 140 may include, for example, a silicon oxide layer and/or a low-k dielectric layer. The lower interlayer insulating layer 140 may cover the top surface of the fifth region R5 of the device isolation pattern ST. Although not illustrated in the drawings, a contact etch stop layer may be interposed between the lower interlayer insulating layer 140 and the device isolation pattern ST, between the lower interlayer insulating layer 140 and the source/drain regions SD, and/or between the interlayer insulating layer 140 and the gate structures GS. For example, the contact etch stop layer may cover the top surfaces of the fifth regions R5 and may extend between the lower interlayer insulating layer 140 and the source/drain regions SD and between the lower interlayer insulating layer 140 and the gate structures GS. The contact etch stop layer may include, for example, a silicon oxide layer and/or a low-k dielectric layer.

An upper interlayer insulating layer may be disposed on the lower interlayer insulating layer 140. The upper interlayer insulating layer may cover the top surfaces of the gate structures GS. The upper interlayer insulating layer may include, for example, a silicon oxide layer, silicon nitride layer, a silicon oxynitride layer, and/or a low-k dielectric layer. First contact plugs and second contact plugs, which penetrate the upper interlayer insulating layer and the lower interlayer insulating layer 140, may be provided to be electrically connected to the source/drain regions SD and the gate electrodes GE, respectively. Interconnection lines may be disposed on the upper interlayer insulating layer to contact the first and second contact plugs. The interconnection lines may be configured to apply voltages to the source/drain regions SD and the gate electrodes GE via the first and second contact plugs. The first and second contact plugs and the interconnection lines may include, for example, a conductive material.

In a typical fin field effect transistor (FinFET) structure in which a gate electrode intersects active patterns protruding from a substrate, the gate electrode may include a first portion on the active patterns and a second portion between active patterns. The second portion may be formed to have an aspect ratio greater than the first portion. As a result, a lower portion of the second portion may include a protrusion, which has a downward slanted sidewall, and a portion of a gate spacer on the protrusion may have relatively a thin thickness. During following processes, a leakage path (e.g., a minute hole passing through the gate spacer) may be formed in the thin portion of the gate spacer. A conductive material of the gate electrode GE may leak out through the leakage path (refer to portion C of FIG. 3C). Accordingly, an electrical short between the gate electrode and source/drain regions adjacent to the gate electrode may occur. Moreover, the likelihood of a failure due to the electrical short may increase in a high pattern density region, e.g., in a region where a distance between the active patterns is narrow.

However, according to example embodiments of the inventive concept, the spacer protection pattern connected to the gate spacer on the protrusion may be provided in the narrow region between the active patterns to prevent generation of the leakage path, thereby preventing the electrical short between the source/drain regions and the gate electrode or reducing the likelihood of such a short from occurring. As a result, the semiconductor device may have improved electrical characteristics and reliability Hereinafter, a method of manufacturing a semiconductor device according to example embodiments of the inventive concept will be described. FIGS. 7A, 8A, 9A, 10A, 11A, 12A, and 13A are cross sectional views illustrating a method of manufacturing a semiconductor device according to an example embodiment of the inventive concept and correspond to cross sectional views taken along the lines I-I' and II-II' of FIG. 1, respectively. FIGS. 7B, 8B, 9B, 10B, 11B, 12B, and 13B are cross sectional views illustrating a method of manufacturing a semiconductor device according to an example embodiment of the inventive concept and correspond to cross sectional views taken along the lines III-III' and IV-IV' of FIG. 1, respectively.

Figure 7A:
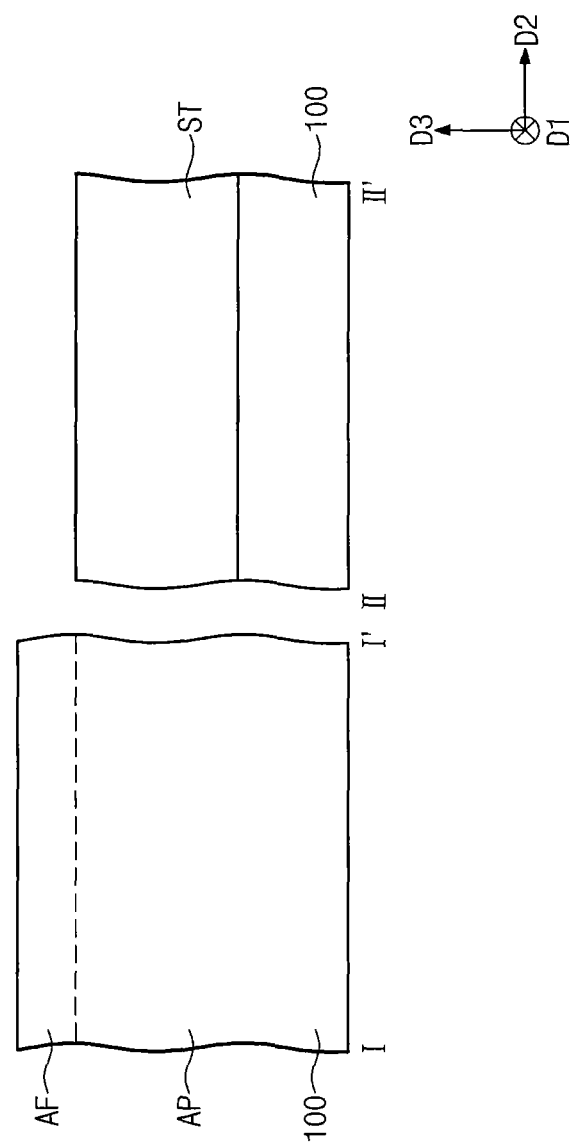
Figure 7B:
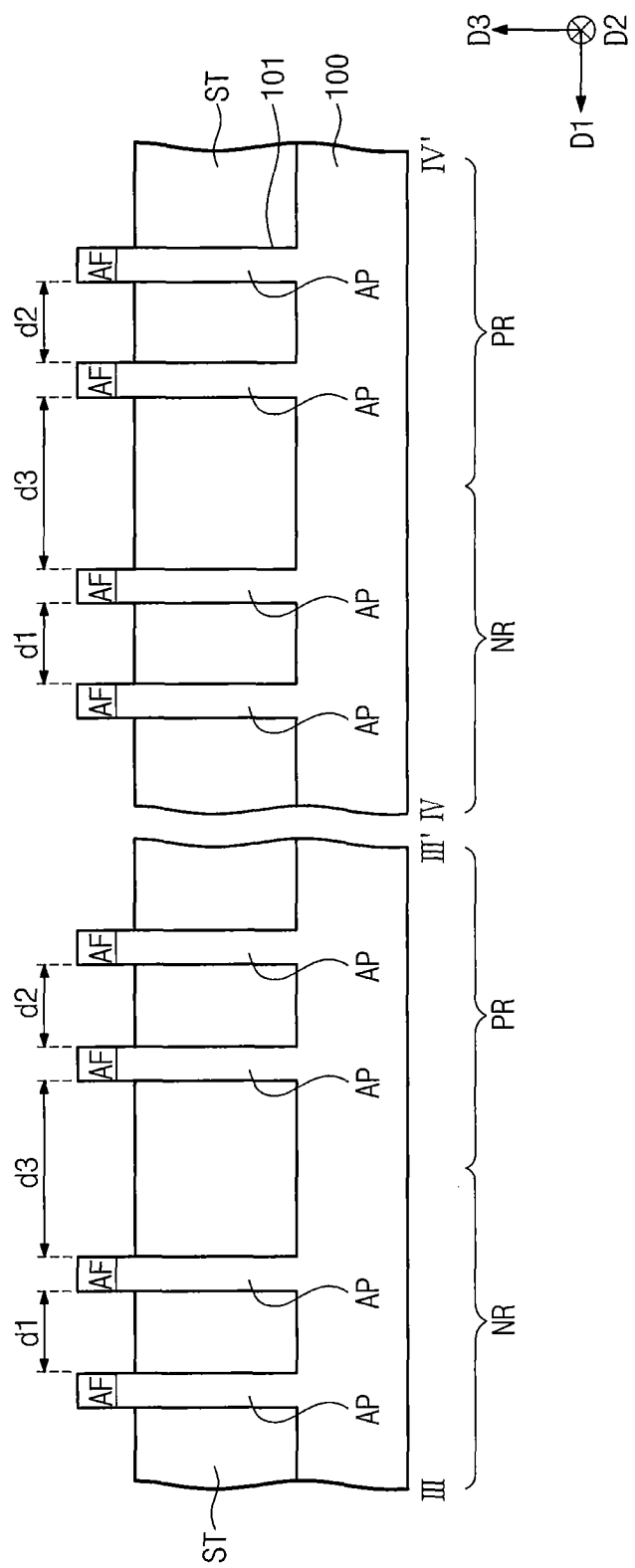
FIGS. 7B, 8B, 9B, 10B, 11B, 12B, and 13B are cross sectional views illustrating a method of manufacturing a semiconductor device according to an example embodiment of the inventive concept and correspond to cross sectional views taken along the lines III-III' and IV-IV' of FIG. 1, respectively.

Referring to FIGS. 7A and 7B, a substrate 100 including a MOSFET region NR and a PMOSFET region PR may be provided. The substrate 100 may be a semiconductor substrate, for example, a silicon substrate, a germanium substrate, or a silicon on insulator (SOI) substrate. N-type transistors may be formed in the NMOSFET region NR, and p-type transistors may be formed in the PMOSFET region PR. The NMOSFET region NR and the PMOSFET region may be arranged in a first direction D1, which is parallel to a top surface of the substrate 100.

The substrate 100 may be patterned to form trenches 101 defining active patterns AP in the NMOSFET and PMOSFET regions. The active patterns AP may be formed to be arranged in the first direction D1 and extend in a second direction D2, which crosses the first direction D1 and is parallel to the top surface of the substrate 100. The active patterns AP may protrude from the substrate 100 in a third direction D3, which is vertical to the top surface of the substrate 100. The active patterns AP in the NMOSFET region NR may be doped with p-type dopants to have a p-type conductivity, and the active patterns AP in the PMOSFET region PR may be doped with n-type dopants to have an n-type conductivity. In some embodiments, the active patterns AP in the NMOSFET region NR may be spaced apart from each other by a first distance d1, and the active patterns AP in the PMOSFET region PR may be spaced apart from each other by a second distance d2. Adjacent ones of the active patterns AP in the NMOSFET region NR and the active patterns AP in the PMOSFET region PR may be spaced apart from each other by a third distance d3. The third distance d3 may be greater than the first and second distances d1 and d2. The third distance d3 may be a minimum distance to separate the NMOSFET region NR and the PMOSFET region PR, which have different conductivity types. The first distance d1 and the second distance d2 may be substantially equal, but are not limited thereto.

A device isolation pattern ST may be formed in the trenches 101. The device isolation pattern ST may be formed to expose upper portions of the active patterns AP in the NMOSFET and PMOSFET regions NR and PR. The upper portion of each of the active patterns AP may be defined as an active fin AF.

Figure 8A:
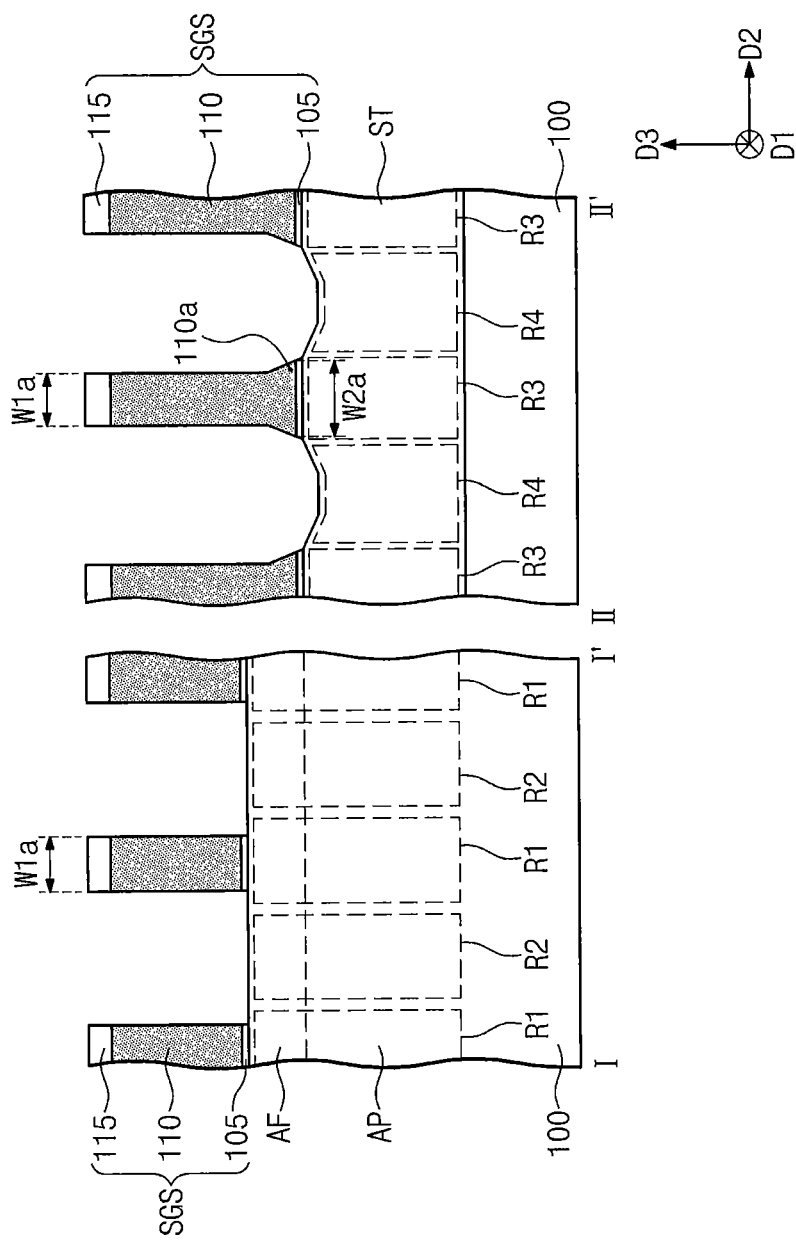
Figure 8B:
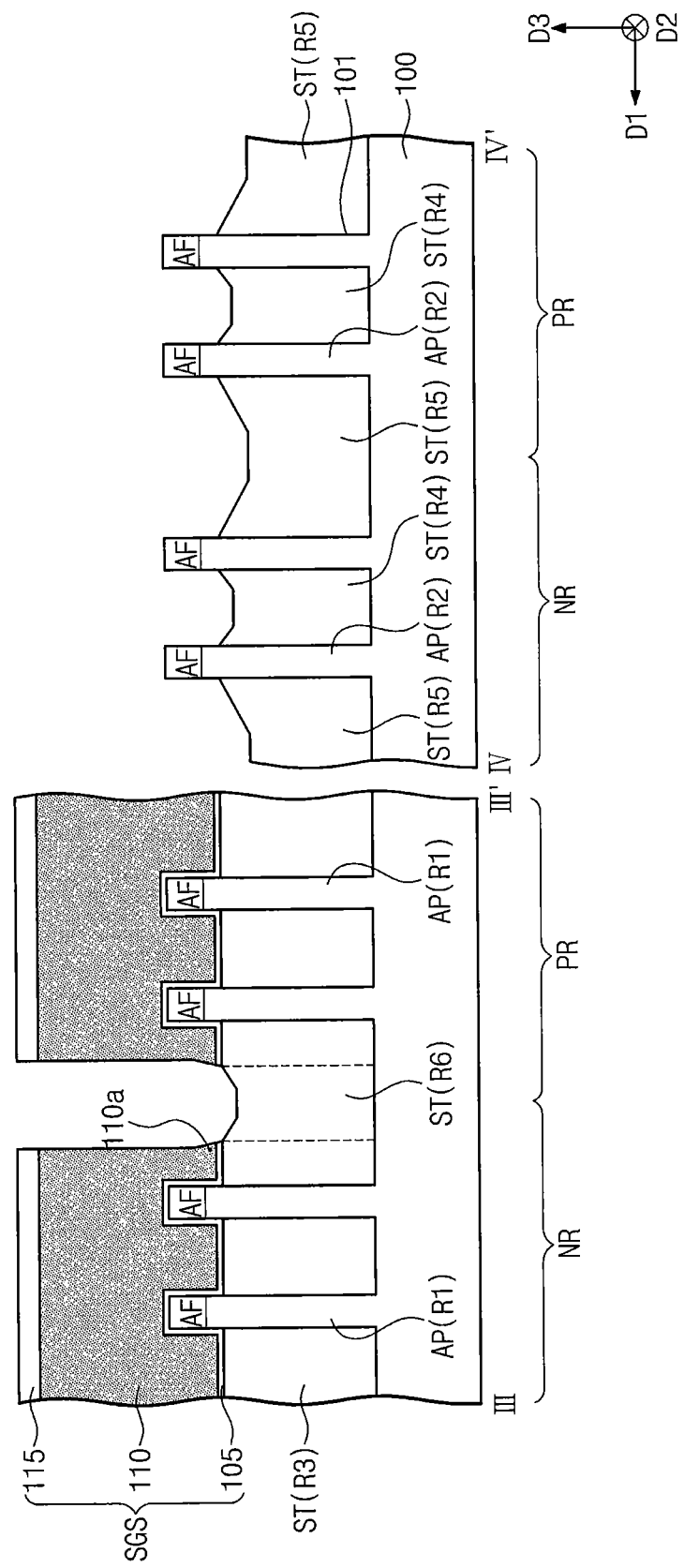

Referring to FIGS. 8A and 8B, a sacrificial gate structure SGS may be formed on the substrate 100. The sacrificial gate structure SGS may include an etch stop pattern 105, a sacrificial gate pattern 110, and a gate mask pattern 115, which are sequentially stacked on the substrate 100.

More specifically, an etch stop layer and a sacrificial gate layer may be sequentially formed on the substrate 100 to cover the active fins AF and the device isolation pattern ST. The etch stop layer may include, for example, silicon oxide. The sacrificial gate layer may include a material having an etch selectivity with respect to the etch stop layer. The sacrificial gate layer may include, for example, poly-silicon. The sacrificial gate layer may be formed by a chemical vapor deposition (CVD) process, a physical vapor deposition (PVD) process, or an atomic layer deposition (ALD) process. A top surface of the sacrificial gate layer may be planarized after forming the sacrificial gate layer. A gate mask pattern 115 may be formed on the planarized sacrificial gate layer, and then an anisotropic etching process may be performed using the gate mask pattern as an etch mask. As a result, the sacrificial gate patterns 110 may be formed to intersect the active patterns AP. The gate mask pattern 115 may include, for example, silicon nitride.

In some embodiments, one portion of the sacrificial gate pattern 110, which is disposed on the top surface of each active fin AP, may be formed to have a vertical sidewall relative to the top surface of the substrate 100, and other portion of the sacrificial gate pattern 110, which is disposed on a top surface of the device isolation pattern ST, may have a sidewall having a slanted portion (or a sidewall having a concave shaped configuration). Such a phenomenon may be caused by a difference of an etching depth and/or a difference of a pattern density in a region to be etched. For example, the other portion of the sacrificial gate pattern 110, which is described above, may have a protrusion 110a laterally protruding from a sidewall of a lower portion thereof. The protrusion 110a may include a downward inclined sidewall toward the device isolation pattern ST. Such a protrusion 110a may be formed because a portion of the sacrificial gate layer exposed by the gate mask pattern 115 (i.e., a portion of the sacrificial gate layer, which is not vertically overlapped with the gate mask pattern 115) remains without being removed when the sacrificial gate layer is anisotropically etched. When the etching depth is deep and the pattern density is high, because penetration of an etchant is not easy, the lower portion of the sacrificial gate pattern 110, which is adjacent to the top surface of the device isolating pattern ST and is not aligned with the gate mask pattern 115, may remain without being etched. The protrusion 110a in a region where the pattern density is high (e.g., a region where a distance between the active patterns AP is narrow) may have a size (e.g., a width or a height) greater than that in a region where the pattern density is low (e.g., a region where a distance between the active patterns AP is wide). As a result, a lower width W2a of the sacrificial gate pattern 110 may be greater than an upper width W1a.

After forming the sacrificial gate pattern 110, the etch stop layer exposed by the sacrificial gate pattern 110 may be removed to form an etch stop pattern 105 under the sacrificial gate pattern 110. The etch stop pattern 105 may extend along a bottom surface of the sacrificial gate pattern 110 to cover the top surfaces and sidewalls of the active fins AF and a portion of the top surface of the device isolation pattern ST. Accordingly, the sacrificial gate structure SGS may be formed.

As the sacrificial gate structure SGS is formed to intersect the active pattern AP, the active pattern AP may be defined to include a first region R1 and a second region R2. The first region R1 may be defined as a portion of the active pattern AP, which is disposed under the sacrificial gate structure SGS, and the second region R2 may be defined as portions of the active pattern AP, which are disposed at opposite sides of the sacrificial gate structure SGS and are horizontally separated from each other by the first region R1 therebetween. Meanwhile, the device isolation pattern ST may be defined to include a third region R3, a fourth region R4, and a fifth region R5. The third region R3 may be defined as a portion of the device isolation pattern ST, which is disposed under the sacrificial gate structure SGS and overlaps with the sacrificial gate structure SGS in a plan view. The fourth and fifth R4 and R5 regions may be defined as other portions of the device isolation pattern ST, which are disposed at opposite sides of the sacrificial gate structure SGS and are horizontally separated by the third regions R3. The fourth region R4 may be positioned between adjacent active patterns AP of each of the NMOSFET and PMOSFET regions NR and PR, and the fifth region R5 may be positioned at a side of adjacent active patterns AP (e.g., at a side of a pair of active patterns AP) of each of the NMOSFET and PMOSFET regions NR and PR and between adjacent ones of the active fins AP in the NMOSFET region NR and the active fins AP in the PMOSFET region PR. Upper portions of the fourth and fifth regions R4 and R5 may be recessed while the sacrificial gate structure SGS is formed. Top surfaces of the fourth and fifth regions R4 and R5 may have a concave shaped configuration toward the substrate 100. The recessed depths of the fourth and fifth regions R4 and R5 may be different from each other according to the pattern density. For example, the recessed depth of the fourth region R4 may be less than that of the fifth region R5.

As illustrated in the drawings, the sacrificial gate structure SGS may be formed in plurality. The plurality of the sacrificial gate structures SGS may be arranged along the second direction D2. At least one of the sacrificial gate structures SGS may be patterned to be divided into two of the sacrificial gate structures SGS. The divided two of the sacrificial gate structures SGS may expose a portion of the third region R3 of the device isolation pattern ST. For ease of description, the exposed portion of the third region R3 may be referred to as a sixth region R6. The sixth region R6 may be recessed like the fourth and fifth regions R4 and R5. The divided two of the sacrificial gate structures SGS may be separated from each other by a fourth distance d4 in the first direction D1. The fourth distance D4 may be less than the third distance D3. One of the divided two of the sacrificial gate structures SGS may intersect the active patterns AP in the NMOSFET region NR, and the other of the divided two of the sacrificial gate structures SGS may intersect the active patterns AP in the PMOSFET region PR.

Figure 9B:
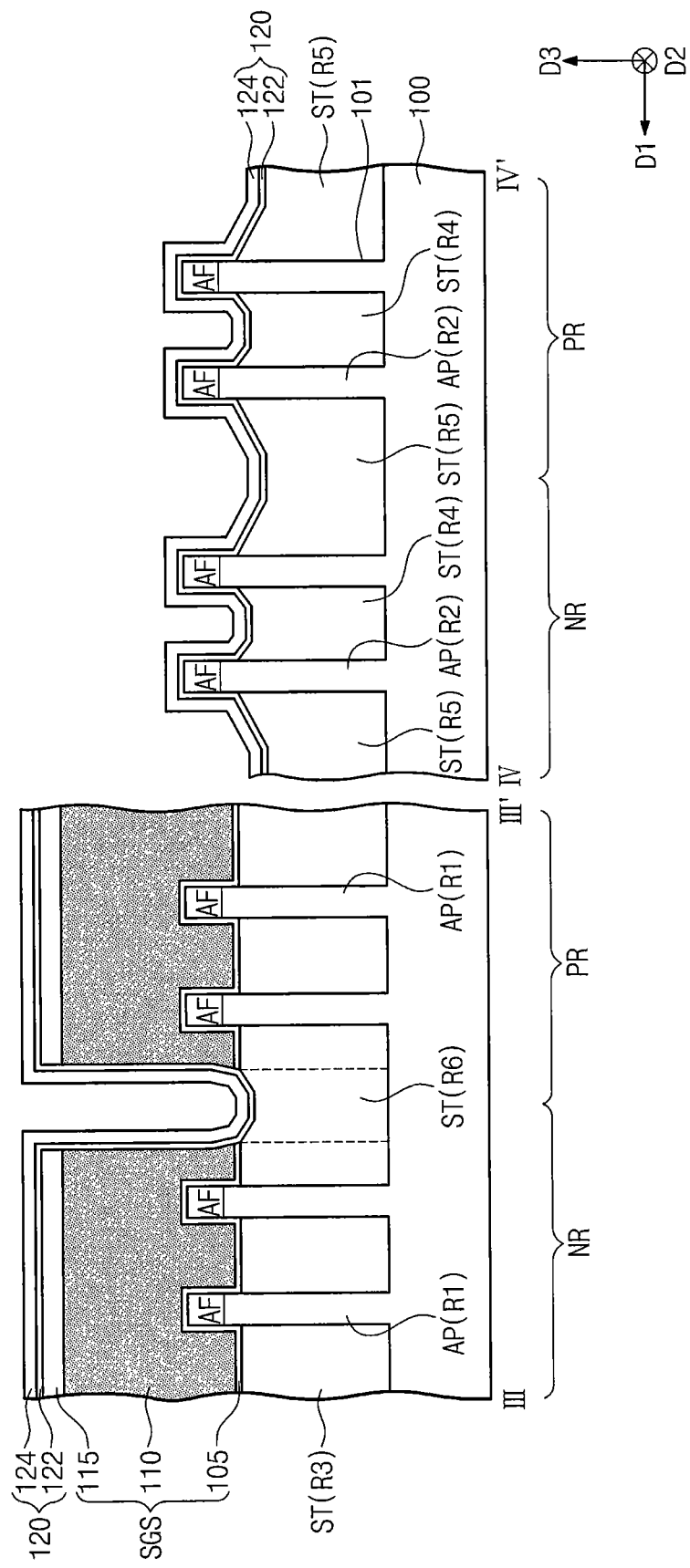

Referring to FIGS. 9A and 9B, a gate spacer layer 120 may be formed on the substrate 100. The gate spacer layer 120 may conformally cover the top surfaces and sidewalls of the sacrificial gate structures SGS and top surfaces of the fourth through sixth regions R4, R5 and R6. The gate spacer layer 120 may be formed of a single layer or multi-layers. For example, the gate spacer layer 120 may include a first gate spacer layer 122 and a second gate spacer layer 124, which are sequentially stacked on the substrate 100. The second gate spacer layer 124 may have a thickness substantially equal to or greater than a thickness of the first gate spacer layer 122, but it is not limited thereto. In some embodiments, the first and second gate spacer layers 122 and 124 may include the same material. For example, the first and second gate spacer layers 122 and 124 may include silicon nitride, silicon oxynitride, and/or silicon oxycarbonitride. In this case, the gate spacer layer 120 may be formed of a substantially single, monolithic layer. In other embodiments, the first and second gate spacer layers 122 and 124 may include different materials from each other. For example, the first gate spacer layer 122 may include silicon oxycarbonitride, and the second spacer layer 124 may include silicon nitride. Alternatively, the second gate spacer layer 124 may include silicon oxycarbonitride, and the first spacer layer 122 may include silicon nitride. In this case, the gate spacer layer 120 may be formed of a double layer. The gate spacer layer 120 may be formed of three or more of layers in other embodiments. The first and second gate spacer layers 122 and 124 may be formed by a CVD process or an ALD process.

Figure 10A:
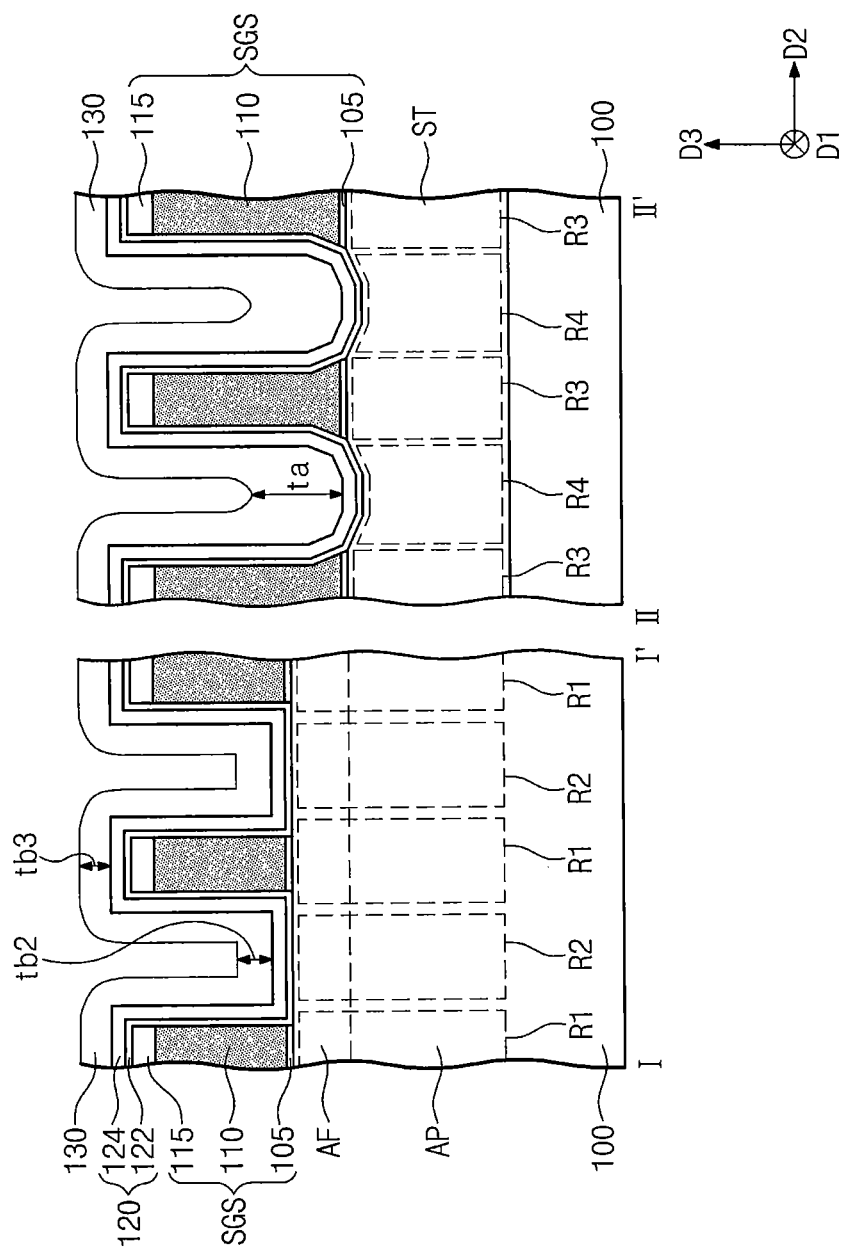
Figure 10B:
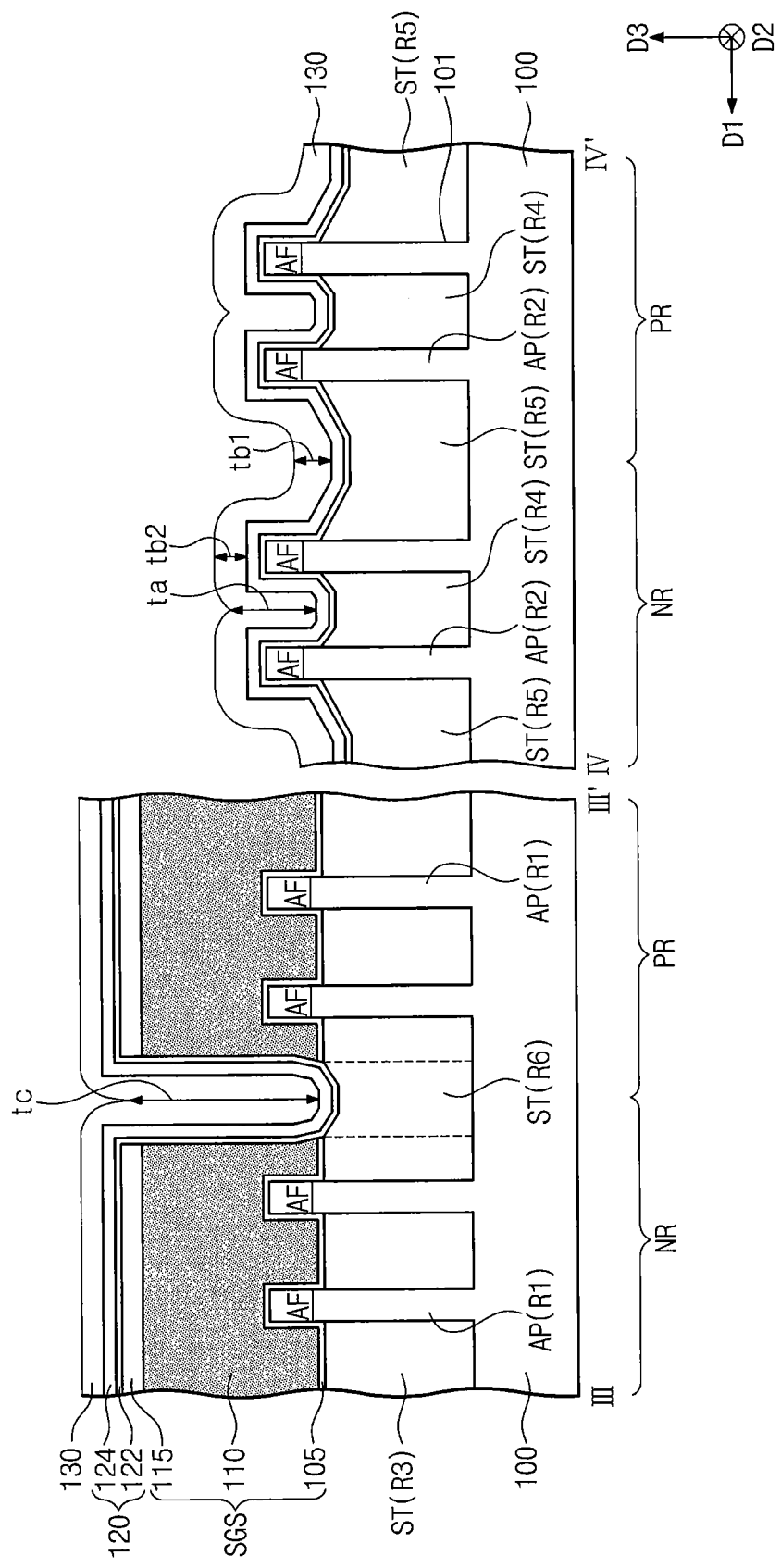

Referring to FIGS. 10A and 10B, after forming the gate spacer layer 120, a sacrificial protection layer 130 may be formed on the substrate 100. The sacrificial protection layer 130 may include a different material from the gate spacer layer 120 and may be formed by a deposition process having an improved step coverage characteristic. For example, the sacrificial protection layer 130 may include a silicon oxide layer formed by an ALD process. The sacrificial layer 130 may be continuously formed on the substrate 100. The sacrificial layer 130 may be formed to have substantially a conformal thickness and to fill spaces between adjacent ones of the active patterns AP in each of the NMOSFET region NR and the PMOSFET region PR. As a result, a thickness ta of a portion of the sacrificial protection layer 130 on the fourth region R4 may be greater than a thickness of other portions of the sacrificial protection layer 130 (e.g., a thickness tb1 of a portion of the sacrificial protection layer 130 on the fifth region R5, a thickness tb2 of a portion of the sacrificial protection layer 130 on a top surface of the second region R2, and/or a thickness tb3 of a portion of the sacrificial protection layer 130 on the top surface of the sacrificial gate structure SGS). The sacrificial protection layer 130 may fill spaces between adjacent ones of the sacrificial gate structures SGS in the first direction D1, thus, a thickness tc of a portion of the sacrificial protection layer 130 on the sixth region R6 may be greater than other thicknesses (e.g., tb1, tb2, and/or tb3) of the sacrificial protection layer 130.

Figure 11A:
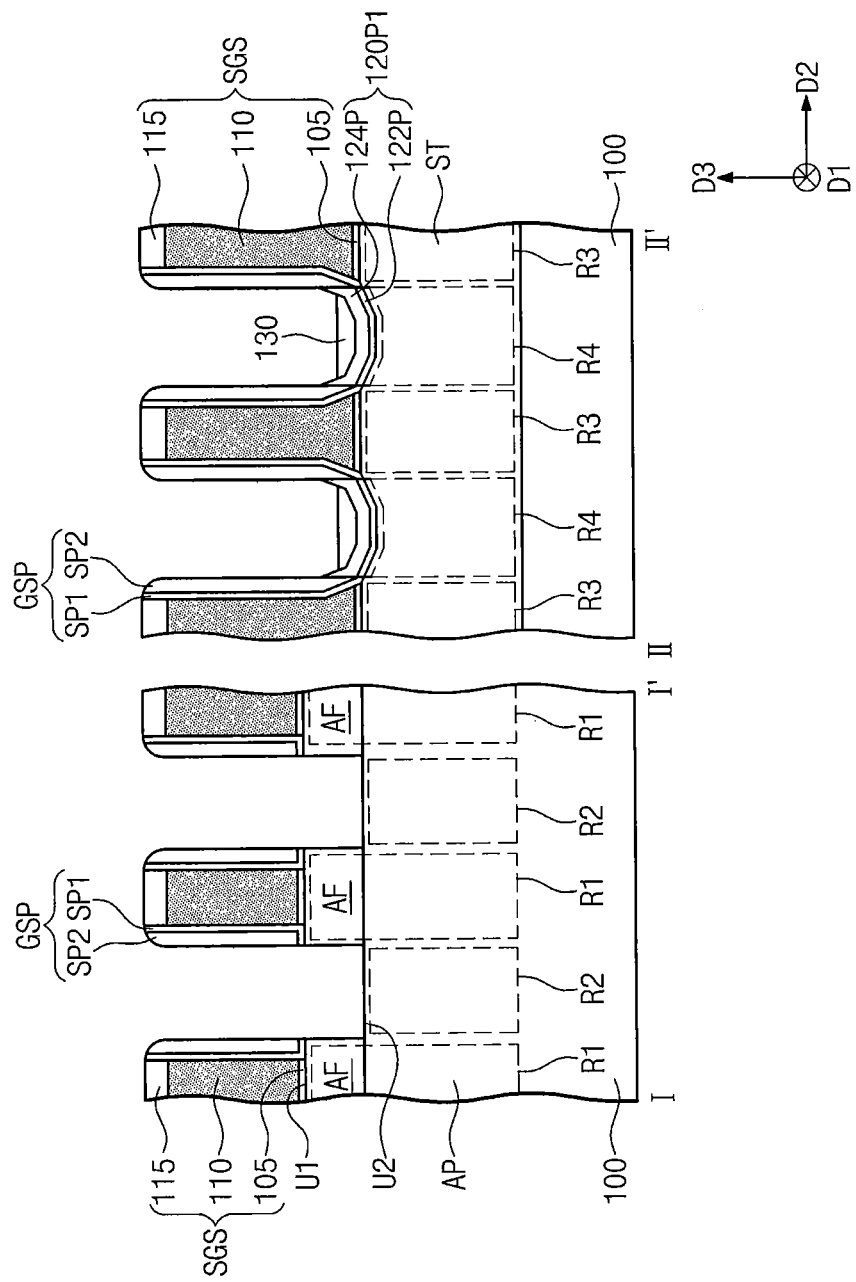
Figure 11B:
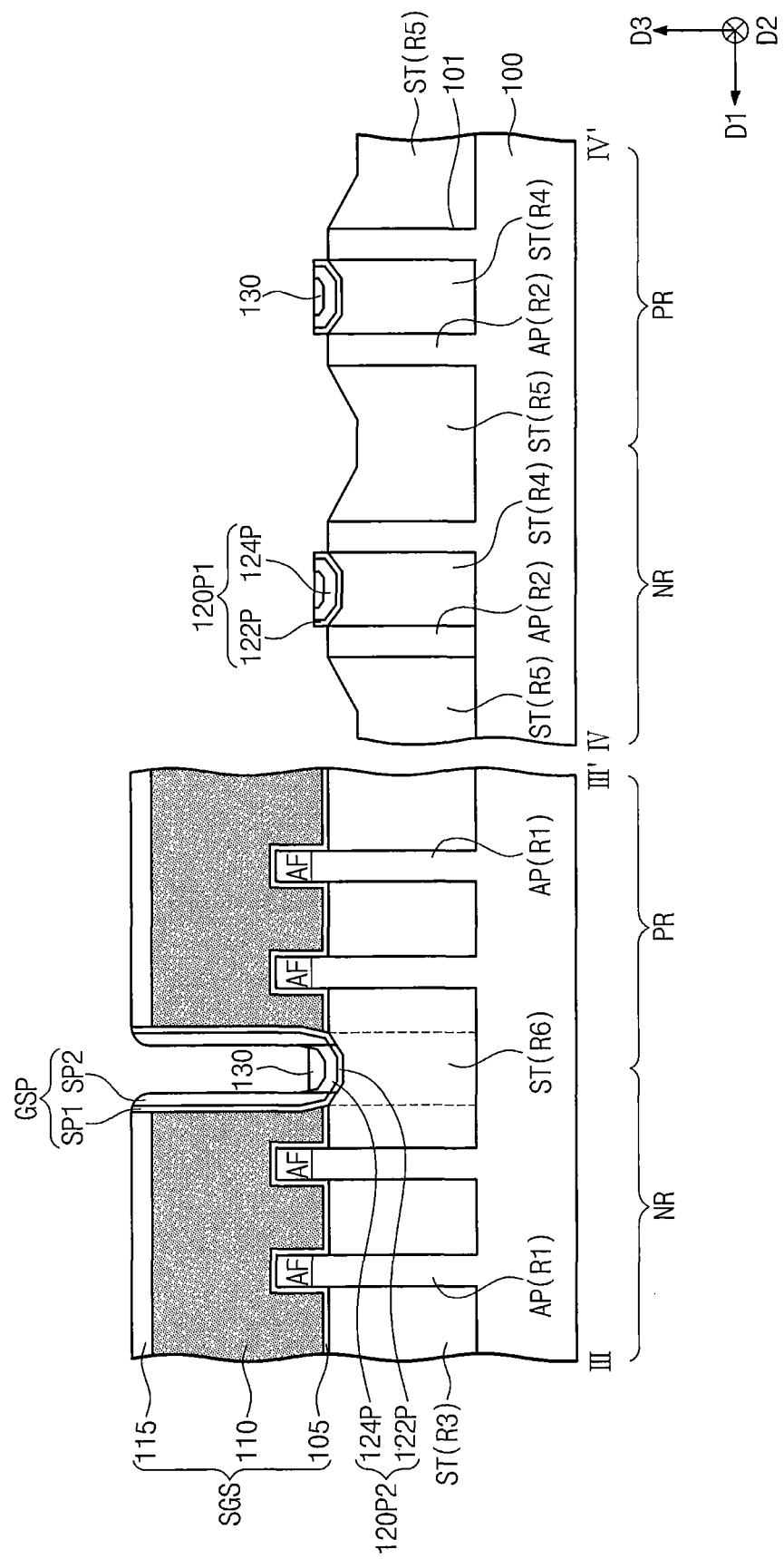
Figure 12A:
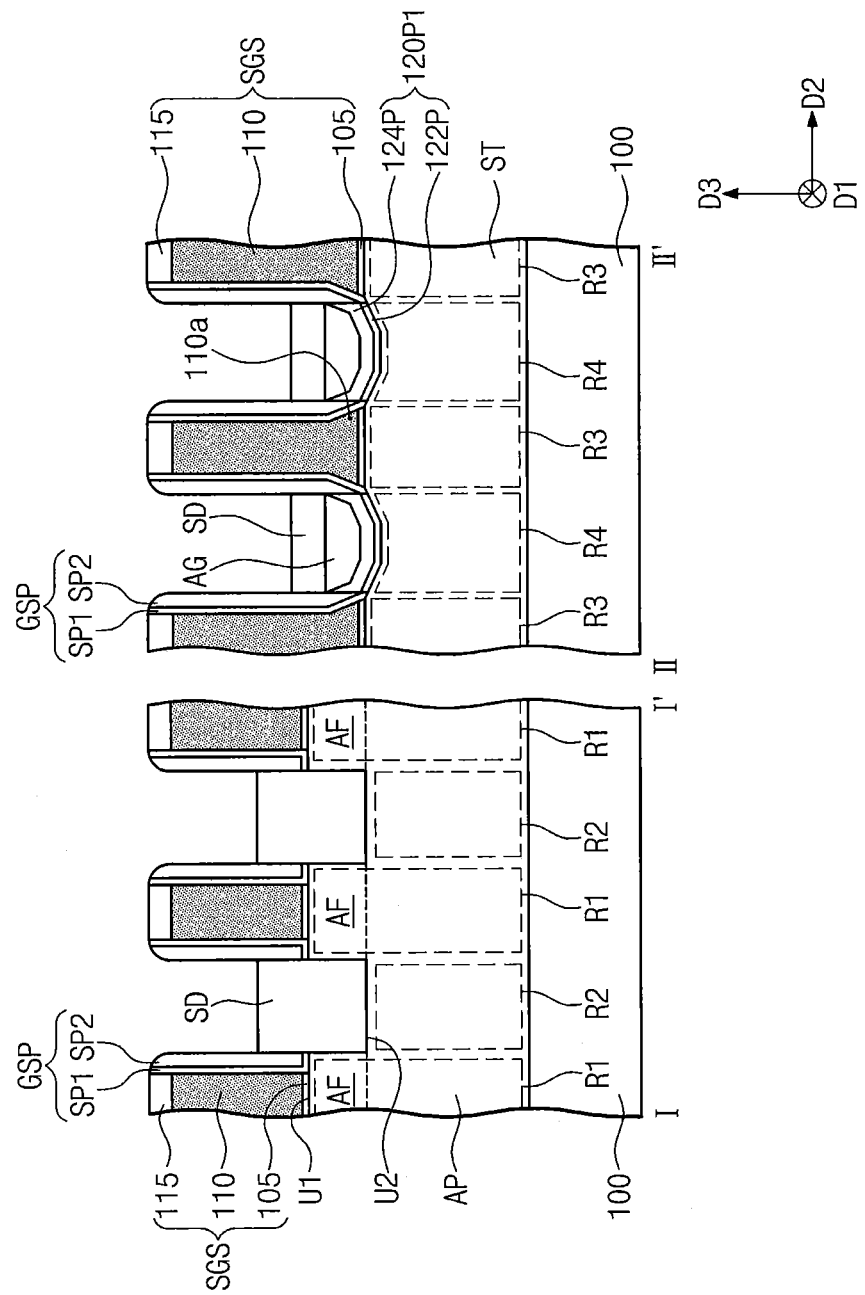
Figure 12B:
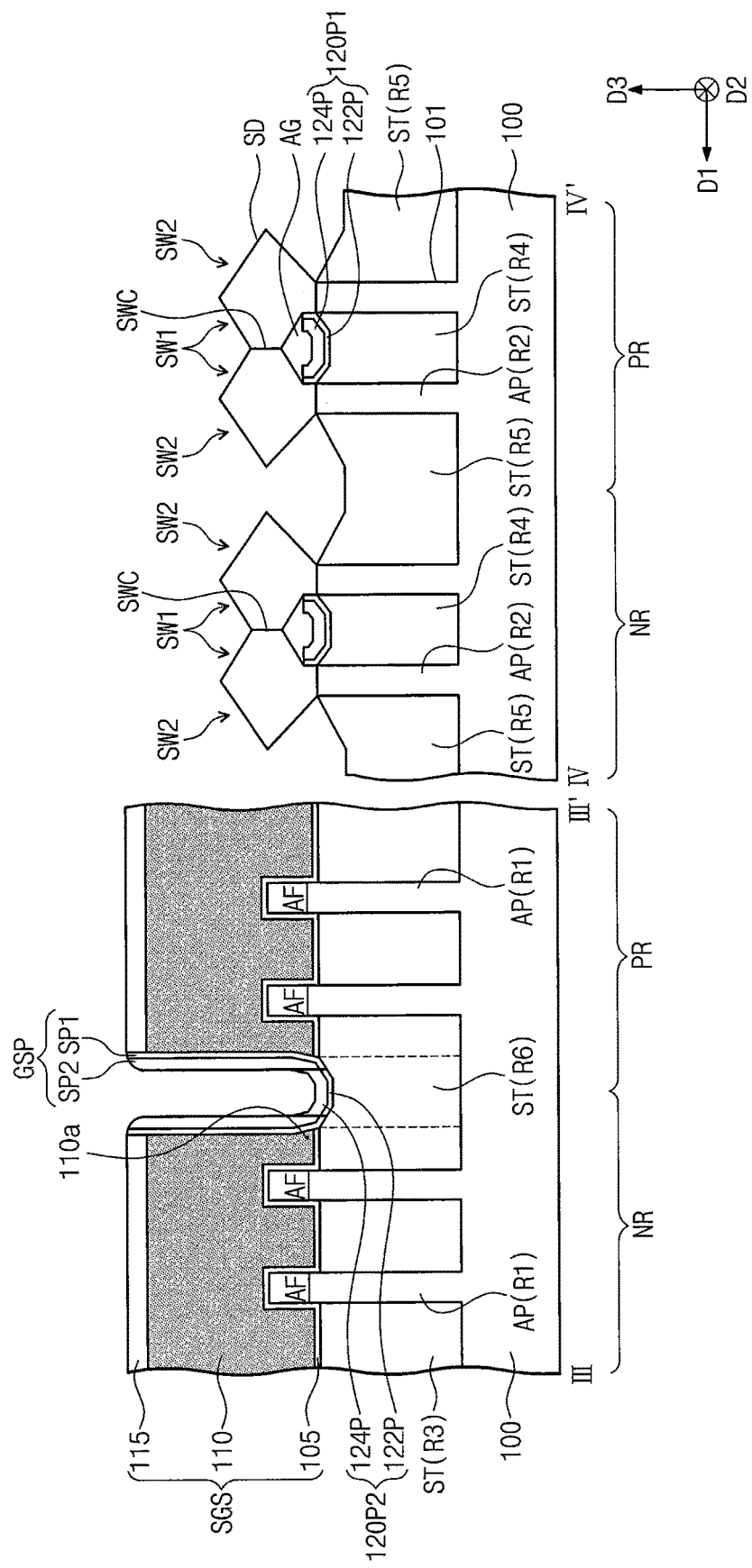

Referring to FIGS. 11A and 11B, upper potions of the active patterns AP at opposite sides of the sacrificial structures SGS may be removed. For example, upper portions of the second regions R2 may be recessed. The process of recessing the upper portions of the second regions R2 may include repeatedly performing a dry etching process and a wet etching process one or more times. A top surface U2 of the second region R2 which are recessed may be lower than a top surface U1 of the first region R1 relative to the top surface of the substrate 100. Although the top surface U1 of the second region R2 is illustrated in FIGS. 11A as being planar, the example embodiments of the inventive concept are not limited thereto. For example, the top surface U2 of the second region R2 may have a concave shaped configuration toward the substrate 100. In this case, a height of the top surface U2 of the second region R2 may correspond to a height of a lowermost portion of the top surface U2 of the second region R2.

When the upper portion of the second region R2 is recessed, the gate spacer layer 120 may be patterned to form a gate spacer GSP on the sidewalls of the sacrificial gate structures SGS. Furthermore, first and second spacer protection patterns 120P1 and 120P2 may be formed on the fourth and sixth regions R4 and R6, respectively. According to the example embodiments of the inventive concept, as the thicknesses ta and tc of the portions of the sacrificial protection layer 130 on the fourth and sixth regions R4 and R6 is greater than the thicknesses tb1, tb2 and tb3 of other portions of the sacrificial protection layer 130, the portions of the sacrificial protection layer 130 on the fourth and sixth regions R4 and R6 may protect the gate spacer layer 120 thereunder when the upper portion of the second region R2 is recessed. Thus, after the second region R2 is recessed, a portion of the gate spacer layer 120 may remain on the fourth and sixth regions R4 and R6; thereby forming first and second spacer protection patterns 120P1 and 120P2. The first and second spacer protection patterns 120P1 and 120P1 may each be a portion of the gate spacer layer 120. The first and second spacer protection patterns 120P1 and 120P2 may each include a first sub-spacer protection pattern 122P and a second sub-spacer protection pattern 124P. The first and second sub-spacer protection patterns 122P and 124P may include, respectively, the same material as the first and second spacer layers 122 and 124. The first and second protection patterns 120P1 and 120P2 may be connected to (or integrally coupled with) the gate spacers GSP on the sidewalls of the sacrificial gate structures SGS adjacent thereto. As shown in FIGS. 11A and 11B, after recessing the second region R2, a portion of the sacrificial protection layer 130 may remain on the first and second spacer protection patterns 120P1 and 120P2. However, the example embodiments of the inventive concept are not limited thereto. For example, the sacrificial protection layer 130 may not remain on the first and second spacer protection patterns 120P1 and 120P2.

In some embodiments, the first spacer protection pattern 120P1 on the fourth region R4 may include a protruding portion, which vertically protrudes over the top surface U2 of the second region R2, but it is not limited thereto. The first spacer protection pattern 120P1 may be formed to have various shapes depending on the thickness to of the sacrificial protection layer 130 on the fourth region R4 and/or an etching condition to recess the upper portion of the second region R2. In other embodiments, when the second region R2 is recessed, other portions of the gate spacer layer 120 may remain, thereby forming the remaining spacers 120R as described with reference to FIGS. 5A and 5B.

Referring to 12A and 12B, the sacrificial protection layer 130 remaining on the first and second protection patterns 120P1 and 120P2 may be removed by performing a cleaning process.

Source/drain regions SD may be formed on the active patterns AP at opposite sides of the sacrificial gate structures SGS. In other words, the source/drain regions SD may be formed on the second regions R2 of the active patterns AP. The source/drain regions SD may be formed by performing an epitaxial growth process. The source/drain regions SD may each be an epitaxial pattern grown using the active pattern AP as a seed layer. The source/drain regions SD in the NMOSFET region NR may be formed to impart a tensile strain to the active fins AF interposed therebetween. For example, when the substrate 100 may be a silicon substrate 100, the source/drain regions SD may be formed of a silicon (Si) layer or a silicon carbide (SiC) layer. However, the example embodiments of the inventive concept are not limited thereto. Alternatively, the source/drain regions SD in the PMOSFET region PR may be formed to impart a compressive strain to the active fins AF interposed therebetween. For example, when the substrate 100 may be a silicon substrate, the source/drain regions SD in the PMOSFT region PR may be formed of a silicon germanium (SiGe) layer. The source/drain regions SD may be doped with dopants during the epitaxial growth process or after the epitaxial growth process. The source/drain regions SD in the NMOSFET region NR may be doped with n-type dopants to have an n-type conductivity and the source/drain regions SD in the PMOSFET region PR may be doped with p-type dopants to have a p-type conductivity. The source/drain regions SD may protrude above the top surface of the first region R1.

In some embodiments, first sidewalls SW1, which face each other, among sidewalls of adjacent source/drain regions SD in each of the NMOSFET and PMOSFET regions NR and PR may be in contact with each other and be connected to each other. The adjacent source/drain regions SD in each of the NMOSFET and PMOSFET regions NR and PR may be integrally coupled with each other. In this case, an air gap AG may be formed under a connected portion SWC of the first sidewalls SW1. However, the embodiments of the inventive concept are not limited thereto. For example, as described with reference to FIGS. 6A and 6B, the first sidewalls SW1, which face each other, of adjacent source/drain regions SD in each of the NMOSFET and PMOSFET regions NR and PR may be separated from each other.

The first sidewalls SW1 of adjacent source/drain regions SD in each of the NMOSFET and PMOSFET regions NR and PR may contact the protruding portion of the first spacer protection pattern 120P1 adjacent thereto. Second sidewalls SW2, which are opposite to the first sidewalls SW1, of the connected source/drain regions SD may have a steep tip in a lateral direction (or in the first direction D1). However, the embodiments of the inventive concepts are not limited thereto. The source/drain regions SD in each of the NMOSFET region NR and the PMOSFET region PR may be formed in various forms according to a shape of the first spacer protection pattern 120P1 and/or whether the remaining spacers 120R exist or not, as described with reference to FIGS. 4A, 4B, 5A, and 5B.

Figure 13A:
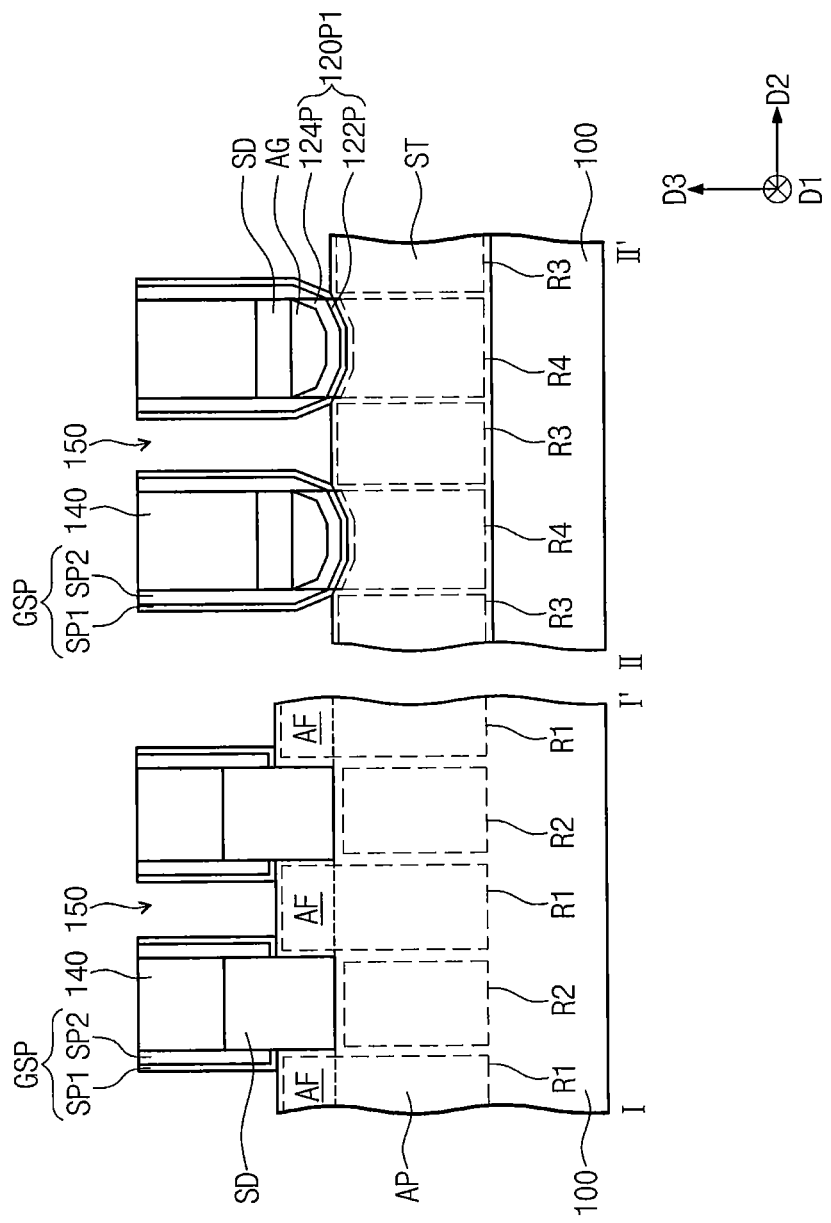
Figure 13B:
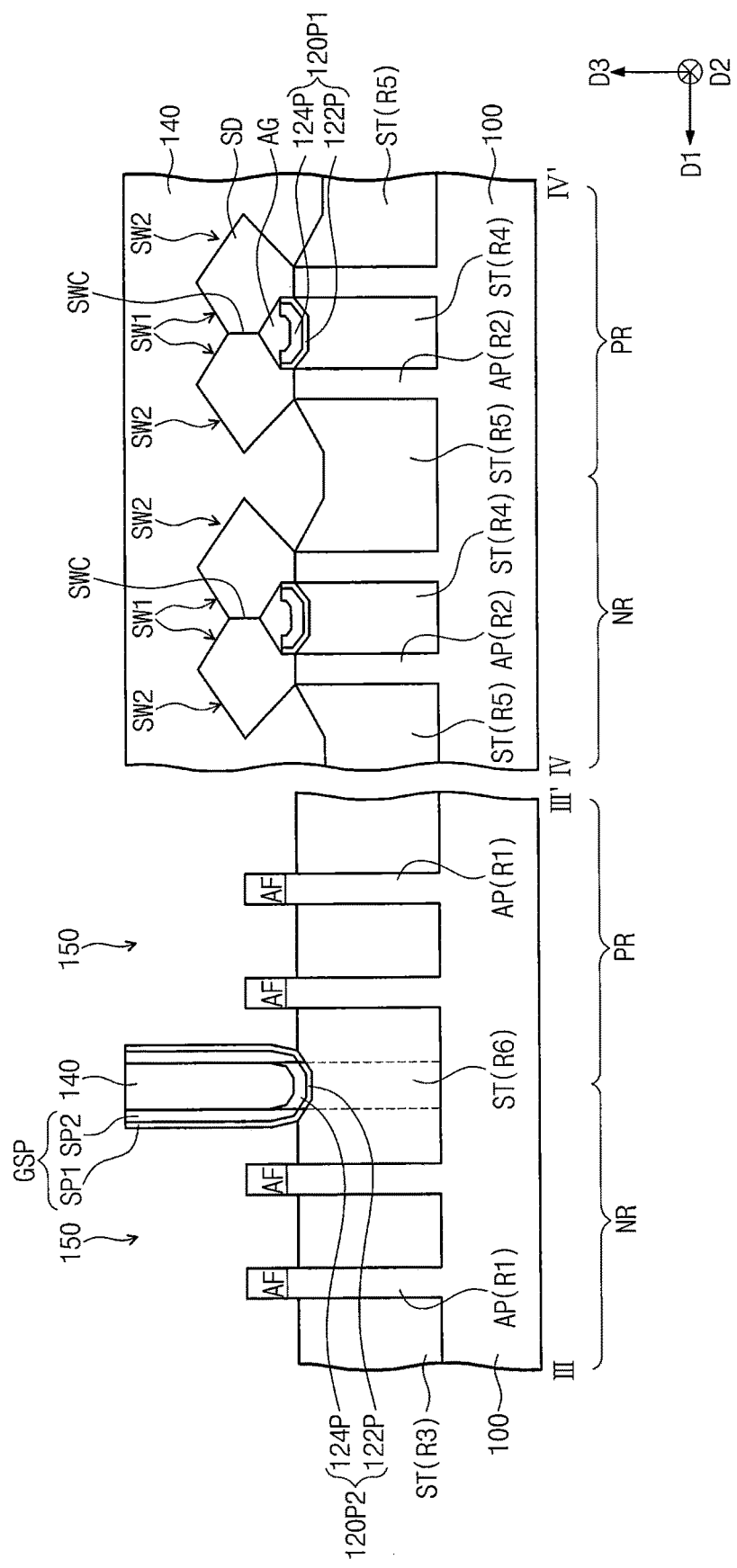

Referring to FIGS. 13A and 13B, a lower interlayer insulating layer 140 may be formed on the substrate 100. The lower interlayer insulating layer 140 may be formed to cover the source/drain regions SD and the sidewalls of the sacrificial gate structure SGS. The lower interlayer insulating layer 140 may include a silicon oxide layer and/or a low-k dielectric layer.

Although not illustrated, a contact etch stop layer may be conformally formed on the substrate 100 before forming the lower interlayer insulating layer 140. The contact etch stop layer may cover the top surface of the fifth region R5 and may extend to a top surface of the gate mask pattern 115 and top surfaces of the source/drain regions SD. The contact etch stop layer may be formed of a material having an etch selectivity with respect to the lower interlayer insulating layer 140. For example, the contact etch stop layer may include a silicon nitride layer and/or a silicon oxynitride layer.

After forming the lower interlayer insulating layer 140, the gate mask pattern 115, the sacrificial gate pattern 110, and the etch stop pattern 105 may be removed, thus a gap region 150 may be formed between the gate spacers GSP. The gap region 150 may expose the top surfaces of the active fins AF and the third region R3. While the gate mask pattern 115 is removed, a portion of the lower interlayer insulating layer 140 and a portion of the gate spacer GSP may be etched. The gap region 150 may be formed by performing the etching process of selectively removing the sacrificial gate pattern 110 and the etch stop pattern 105. During the formation of the gap region 150, a portion of the sidewalls of the gate spacer GSP exposed by the gap region 150 may be etched. Typically, when etching damage to the gate spacer GSP is great during forming the gap region 150, a leakage path (e.g., a minute hole) may be formed in the gate spacer GSP on the protrusion 110a. Thus, in a following process, a conductive material to be formed in the gap region 150 may be leaked out through the leakage path. However, according to example embodiments of the inventive concept, the first and second spacer protection patterns 120P1 and 120P2, which are formed to be connected to the gate spacer GSP on the protrusion 110a, may prevent or reduce leak of the conductive material in the gap region 150 to the outside through the leakage path.

Referring back to FIGS. 2A and 2B, a gate dielectric pattern GD and a gate electrode GE may be formed to fill the gap region 150 illustrated in FIGS. 13A and 13B. For example, the gate dielectric layer may be formed on the substrate 100 to fill a portion of the gap region 150 of FIGS. 13A and 13B. The gate dielectric layer may be formed to cover the top surfaces and sidewalls of the active fins AF and the top surface of the third region R3. The gate dielectric layer may include, for example, a high-k dielectric material. The gate dielectric layer may include hafnium oxide, hafnium silicate, zirconium oxide, and/or zirconium silicate, but it is not limited thereto. The gate dielectric layer may be formed using an atomic layer deposition process or a chemical vapor deposition process. A gate layer may be formed on the gate dielectric layer to fill the gap region 150 having the gate dielectric layer therein. The gate layer may include a conductive metal nitride (e.g., titanium nitride, tantalum nitride, and/or tungsten nitride) and/or metal (e.g., aluminum and/or tungsten). The sequentially stacked gate dielectric layer and the gate layer may be planarized to form the gate dielectric pattern GD and the gate electrode GE. Due to the planarization process, top surfaces of the lower interlayer insulating layer 140 and the gate spacer GSP may be exposed. The gate dielectric pattern GD may extend along a bottom surface of the gate electrode GE and may extend to sidewalls of the gate electrode GE to be interposed between the gate electrode GE and the gate spacer GSP.

An upper portion of the gate electrode GE may be recessed. During the recess process, an upper portion of the gate dielectric pattern GD may also be recessed. A gate capping pattern GP may be formed in a space where the gate electrode GE and the gate dielectric pattern GD are removed. The gate capping pattern GP may include, for example, silicon nitride. The gate dielectric pattern GD, the gate electrode GE, and the gate capping pattern GP may constitute a gate structure GS.

An upper interlayer insulating layer may be formed on the substrate 100 having the gate structures GS thereon. The upper interlayer insulating layer may include, for example, a silicon oxide layer, s silicon nitride layer, a silicon oxynitride layer, and/or a low-k dielectric layer. First contact holes may be formed to penetrate the upper interlayer insulating layer and the lower interlayer insulating layer 140 and expose the source/drain regions SD. The source/drain regions SD may be partially removed by an etching process of forming the first contact holes. Second contact holes may be formed to penetrate the upper interlayer insulating layer and the lower interlayer insulating layer 140 and expose the gate electrodes GD. First and second contact plugs may be formed to fill the first and second contact holes, respectively. Interconnection lines may be formed to contact the first and second contact plugs, respectively. The interconnection lines and the first and second contact plugs may be configured to apply voltages to the source/drain regions SD and the gate electrodes GE. The first and second contact plugs and the interconnection lines may include a conductive material.

Figure 14:
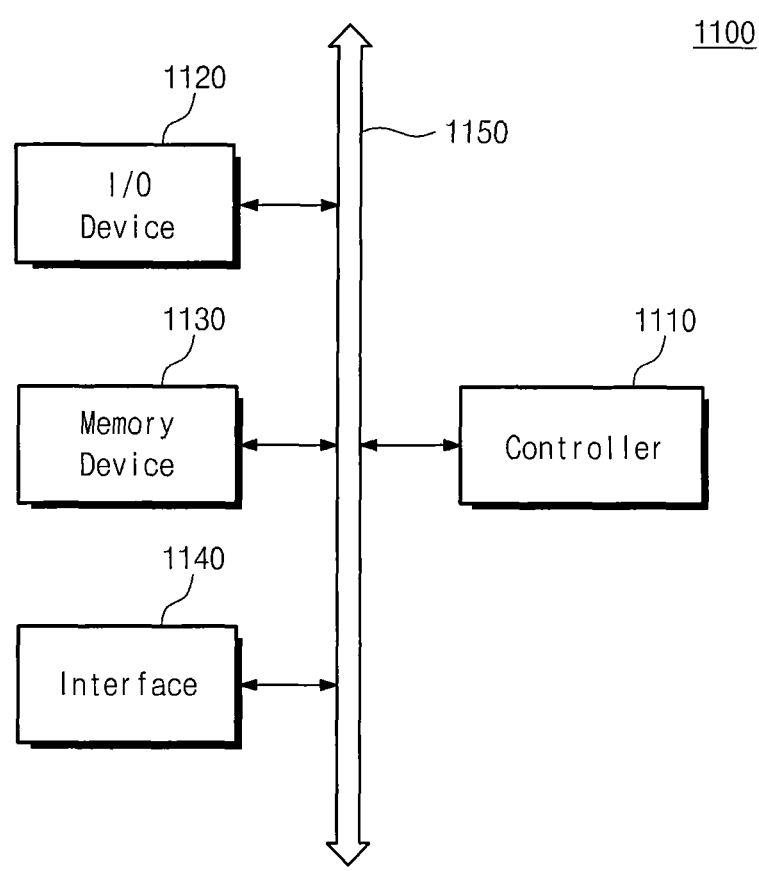
FIG. 14 is a schematic block diagram illustrating an electronic system according to example embodiments of the inventive concept.

FIG. 14 is a schematic block diagram illustrating an electronic system according to example embodiments of the inventive concept.

Referring to FIG. 14, an electronic system 1100 according to example embodiments of the inventive concepts may include a controller 1110, an input/output (I/O) unit 1120, a memory device 1130, an interfacial unit 1140, and a data bus 1150. At least two of the controller 1110, the I/O unit 1120, the memory device 1130, and the interfacial unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O device 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna and/or a wireless/cable transceiver. Although not shown in the drawings, the electronic system 1100 and/or controller 1110 may further include a fast dynamic random access memory (DRAM) device and/or a fast static random access memory (SRAM) device, which acts as a cache memory or a working memory for improving an operation of the controller 1110. At least one of the semiconductor devices according to the aforementioned example embodiments of the inventive concept may be provided into the memory device 1130, the controller 1110, the working memory (or the cache memory), and/or the I/O device 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless communication methods.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a first active pattern and a second active pattern protruding from a substrate, the first and second active patterns being spaced apart from each other in a first direction;
    a first gate electrode and a second gate electrode intersecting the first and second active patterns, the first and second gate electrodes being spaced apart from each other in a second direction crossing the first direction;
    a first gate spacer on a sidewall of the first gate electrode and a second gate spacer on a sidewall of the second gate electrode;
    a first source/drain region and a second source/drain region on the first active pattern and the second active pattern, respectively, between the first and second gate electrodes, the first and second source/drain regions being adjacent to each other in the first direction; and
    a spacer protection pattern between the first and second active patterns and between the first and second gate electrodes, the spacer protection pattern being commonly connected to the first and second gate spacers and commonly contacting the first and second source/drain regions.

2. The semiconductor device of claim 1, wherein the spacer protection pattern and the first and second gate spacers are configured to have a U-shaped configuration in a cross-sectional view taken along the second direction.

3. The semiconductor device of claim 1, wherein the spacer protection pattern is in contact with first sidewalls, which face each other, among sidewalls of the first and second source/drain regions.

4. The semiconductor device of claim 3, wherein the first sidewalls of the first and second source/drain regions are connected to each other such that the first sidewalls of the first and second source/drain regions comprise a connected portion.

5. The semiconductor device of claim 4, further comprising an air gap under the connected portion.

6. The semiconductor device of claim 1, wherein each of the first and second active patterns comprises:
    a first region under the first and second gate electrodes; and
    a second region between the first and second gate electrodes,
    wherein a top surface of the second region is lower than a top surface of the first region relative to a top surface of the substrate.

7. The semiconductor device of claim 6, further comprising:
    a device isolation pattern on the substrate, the device isolation pattern covering a portion of sidewalls of each of the first and second active patterns,
    wherein the device isolation pattern comprises:
        a third region under the first and second gate electrodes;
        a fourth region between the first and second gate electrodes, the fourth region having a top surface, which has a downward concave shaped configuration relative to the substrate, and
    wherein the spacer protection pattern covers the fourth region.

8. A semiconductor device comprising:
    first, second, and third active patterns protruding from a substrate and parallel to each other, the first and second active patterns being spaced apart from each other by a first distance, the third active pattern being spaced apart from the second active pattern by a second distance, which is greater than the first distance;
    a first gate electrode and a second gate electrode intersecting the first, second, and third active patterns;
    a first gate spacer and a second gate spacer on sidewalls of the first gate electrode and the second gate electrode, respectively;
    first, second, and third source/drain regions on the first, second, and third active patterns, respectively, at a side of each of the first and second gate electrodes; and
    a first spacer protection pattern extending between the first and second active patterns and commonly connected to the first and second gate spacers, the first spacer protection pattern comprising a same material as the first and second gate spacers.

9. The semiconductor device of claim 8, wherein the first spacer protection pattern is in contact with first sidewalls, which face each other, among sidewalls of the first and second source/drain regions.

10. The semiconductor device of claim 9, further comprising:
a remaining spacer on a lower portion of at least one of second sidewalls of the first and second source/drain regions opposite to the first sidewalls of the first and second source/drain regions,
wherein the remaining spacer comprises a same material as the first and second gate spacers.

11. The semiconductor device of claim 8, wherein each of the first, second, and third active patterns comprises:
a first region under the first and second gate electrodes; and
a second region between the first and second gate electrodes, the second region having a top surface, which is lower than a top surface of the first region relative to a top surface of the substrate, and
wherein each of the first, second, and third source/drain regions is on the second region.

12. The semiconductor device of claim 11, further comprising a device isolating pattern on the substrate and exposing an upper portion of each of the first, second, and third active patterns,
wherein the device isolation pattern comprises:
a third region under the first and second gate electrodes;
a fourth region between the first and second gate electrodes and between the first and second active patterns; and
a fifth region between the first and second gate electrodes and between the second and third active patterns, and
wherein the fourth region comprises a first recess region having a first bottom surface, the fifth region comprises a second recess region having a second bottom surface, and the first spacer protection pattern is on the fourth region and contacts the first bottom surface.

13. The semiconductor device of claim 12, wherein the first bottom surface is lower than a top surface of the third region and is higher than the second bottom surface relative to the top surface of the substrate.

14. The semiconductor device of claim 8, wherein the first and second source/drain regions have a first conductivity type, and the third source/drain region has a second conductivity type opposite to the first conductivity type.

15. The semiconductor device of claim 8, further comprising:
a third gate electrode spaced apart from the second gate electrode by a third distance in a lengthwise direction of the second gate electrode;
a third gate spacer on sidewalls of the third gate electrode; and
a second spacer protection pattern between the second gate spacer and the third gate spacer and commonly connected to the second gate spacer and the third gate spacer.

16. A semiconductor device, comprising:
a substrate;
a first gate electrode and a second gate electrode on the substrate;
a first gate spacer and a second gate spacer on sidewalls of the first gate electrode and the second gate electrode, respectively;
a spacer protection pattern connecting the first gate spacer to the second gate spacer;
a source/drain region between the first gate spacer and the second gate spacer; and
a void between the source/drain region and the substrate.

17. The semiconductor device of claim 16, wherein each of the first gate spacer and the second gate spacer has an upper portion and a lower portion relative to the substrate;
wherein a thickness of the upper portion is approximately equal to a thickness of the spacer protection pattern approximately midway between the first gate spacer and the second gate spacer; and
wherein the spacer protection pattern contacts the source/drain region.

18. The semiconductor device of claim 16, wherein each of the first gate spacer and the second gate spacer has an upper portion and a lower portion relative to the substrate;
wherein a thickness of the upper portion is greater than a thickness of the spacer protection pattern approximately midway between the first gate spacer and the second gate spacer; and
wherein the spacer protection pattern does not contact the source/drain region.

19. The semiconductor device of claim 16, wherein the spacer protection pattern comprises a monolithic layer comprising a same material as the first gate spacer and the second gate spacer; and
wherein the same material comprises one of silicon nitride, silicon oxynitride, and silicon oxycarbonitride.

20. The semiconductor device of claim 16, wherein each of the sidewalls of the first gate electrode and the second gate electrode, respectively, has an upper portion and a lower portion relative to the substrate; and
wherein the lower portions of the first gate electrode and the second gate electrode extend towards the spacer protection pattern.

* * * * *